United States Patent
Lin et al.

(10) Patent No.: US 12,266,541 B2
(45) Date of Patent: Apr. 1, 2025

(54) SEMICONDUCTOR DEVICE AND METHOD

(71) Applicant: Taiwan Semiconductor Manufacturing Co., Ltd., Hsinchu (TW)

(72) Inventors: Sung-En Lin, Hsinchu (TW); Chunyao Wang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 200 days.

(21) Appl. No.: 17/350,206

(22) Filed: Jun. 17, 2021

(65) Prior Publication Data

US 2022/0262649 A1 Aug. 18, 2022

Related U.S. Application Data

(60) Provisional application No. 63/150,733, filed on Feb. 18, 2021.

(51) Int. Cl.
*H01L 21/3213* (2006.01)
*H01L 21/02* (2006.01)
*H01L 21/311* (2006.01)

(52) U.S. Cl.
CPC .. *H01L 21/32139* (2013.01); *H01L 21/02164* (2013.01); *H01L 21/02274* (2013.01); *H01L 21/0228* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| | | |
|---|---|---|
| 8,728,332 B2 | 5/2014 | Lin et al. |
| 8,796,666 B1 | 8/2014 | Huang et al. |
| 8,822,243 B2 | 9/2014 | Yan et al. |
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,501,601 B2 | 11/2016 | Chang et al. |
| 9,502,265 B1 | 11/2016 | Jiang et al. |

(Continued)

FOREIGN PATENT DOCUMENTS

| | | |
|---|---|---|
| KR | 20100109855 A | 10/2010 |
| KR | 20170139781 A | 12/2017 |
| KR | 20190100035 A | 8/2019 |

*Primary Examiner* — Stephanie P Duclair
(74) *Attorney, Agent, or Firm* — Slater Matsil, LLP

(57) ABSTRACT

In an embodiment, a method includes: forming a photoresist over a target layer; performing a plasma-enhanced deposition process, the plasma-enhanced deposition process etching sidewalls of the photoresist while depositing a spacer layer on the sidewalls of the photoresist; patterning the spacer layer to form spacers on the sidewalls of the photoresist; and etching the target layer using the spacers and the photoresist as a combined etching mask.

20 Claims, 30 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,548,303 B2 | 1/2017 | Lee et al. |
| 9,576,814 B2 | 2/2017 | Wu et al. |
| 9,608,116 B2 | 3/2017 | Ching et al. |
| 10,153,170 B2 | 12/2018 | Jang et al. |
| 2010/0255218 A1* | 10/2010 | Oka .................. C23C 16/45542 427/579 |
| 2015/0243520 A1 | 8/2015 | Park et al. |
| 2019/0096686 A1* | 3/2019 | Hsu .................. H01L 29/66795 |
| 2019/0259612 A1* | 8/2019 | Nozawa .............. H01L 21/0337 |
| 2019/0362961 A1* | 11/2019 | Girard .................. C23C 16/515 |
| 2020/0273705 A1* | 8/2020 | Singh ................ H01L 21/31144 |

* cited by examiner

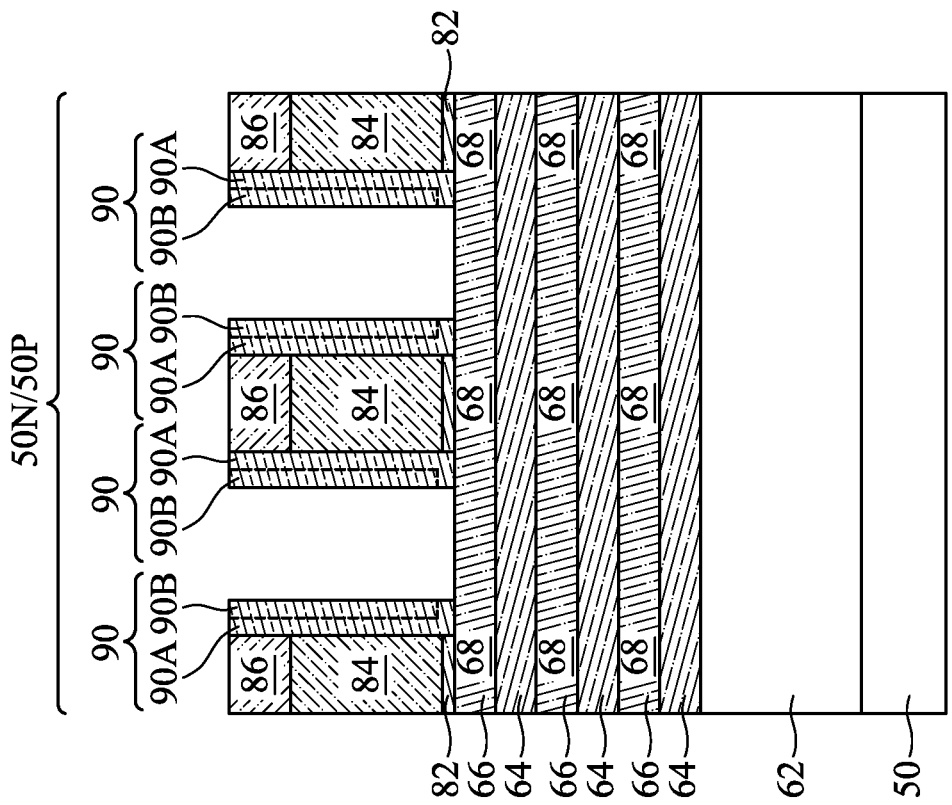
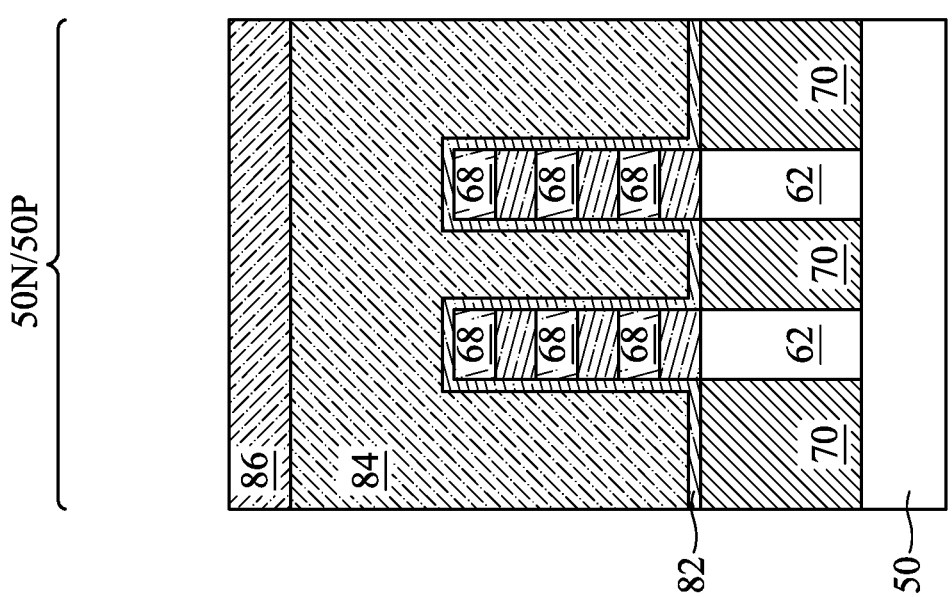
Figure 11A
Figure 11B

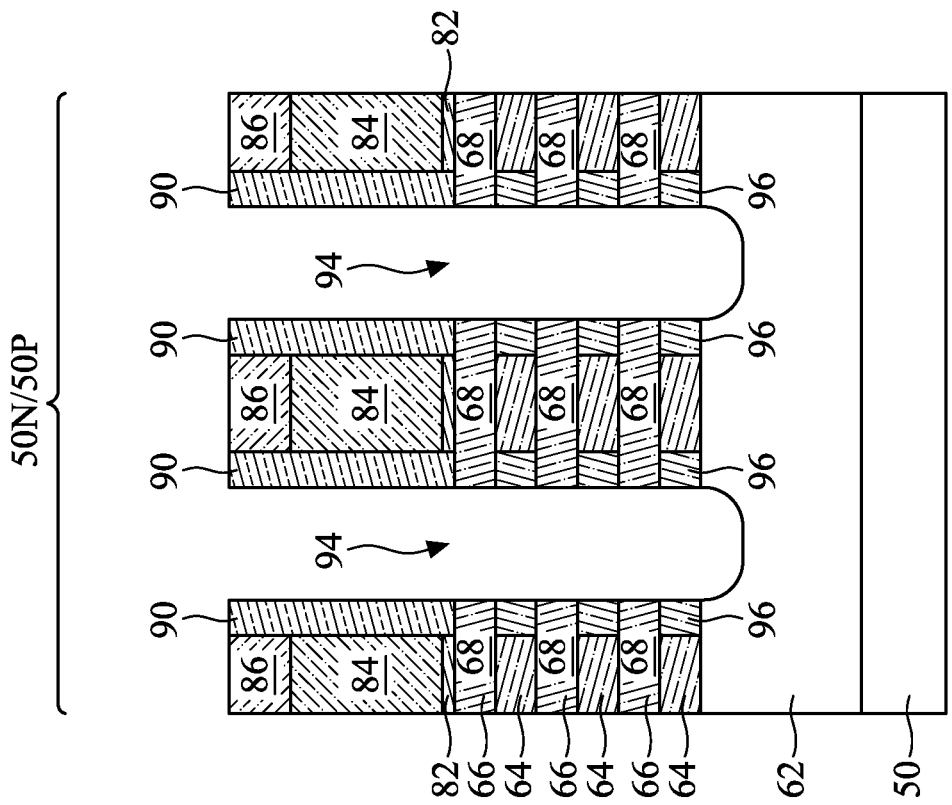
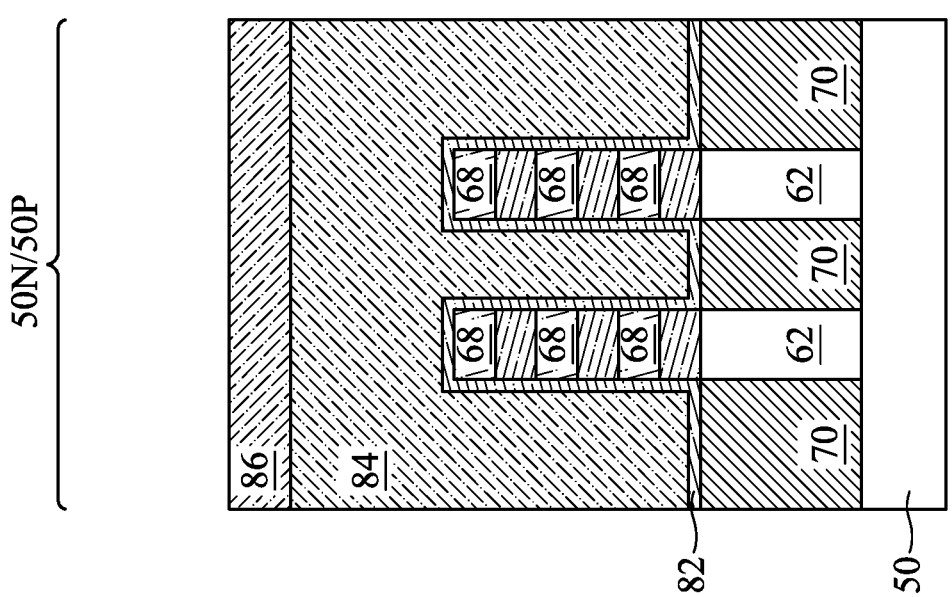
Figure 12B
Figure 12A

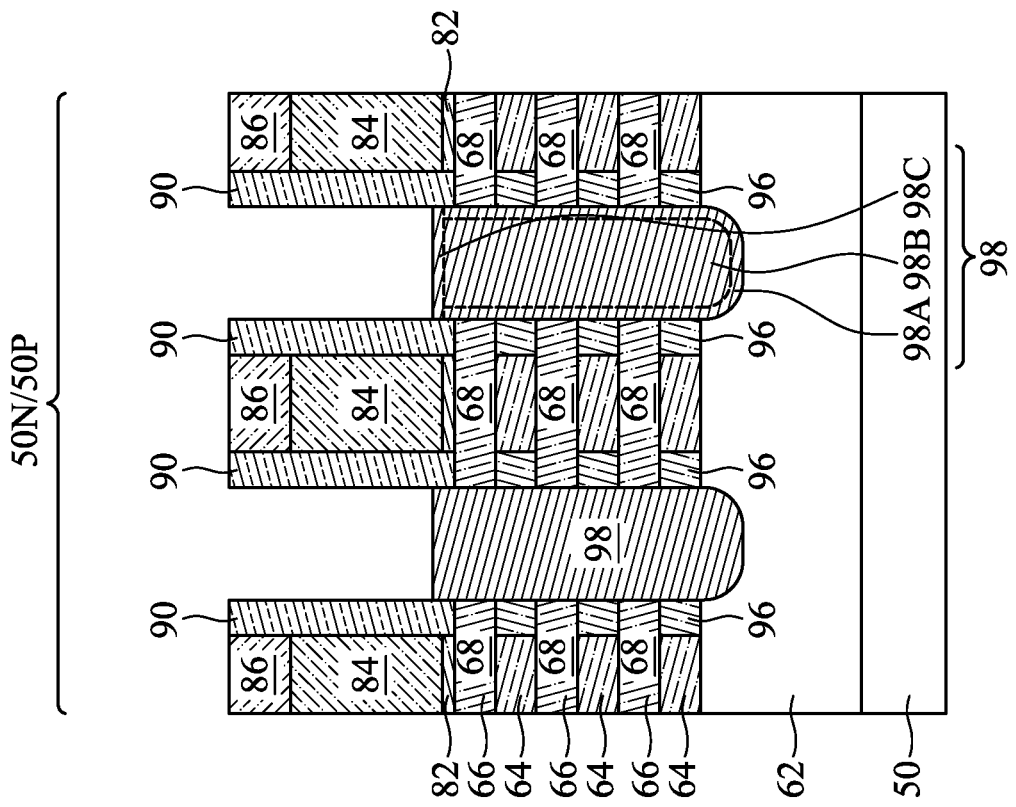
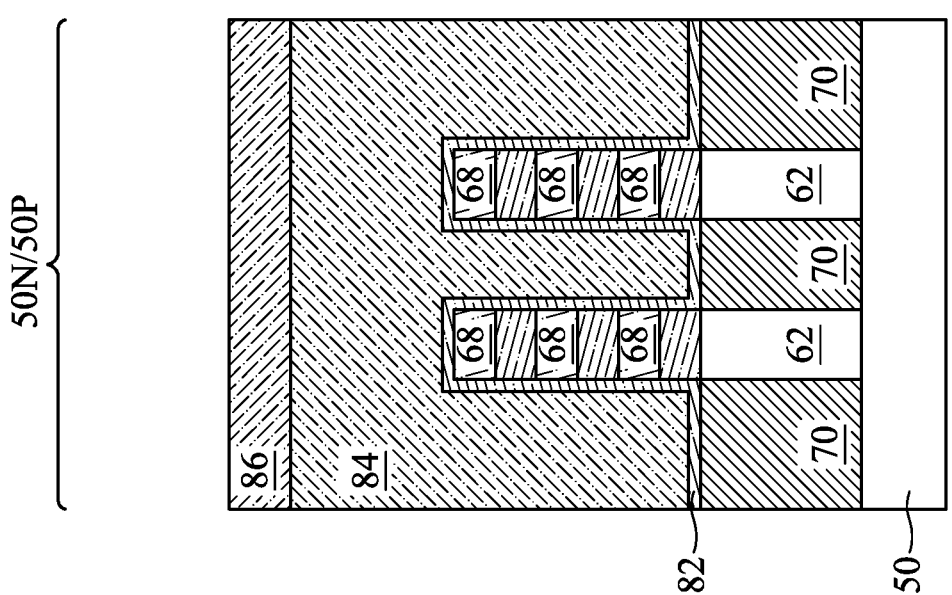
Figure 13B
Figure 13A

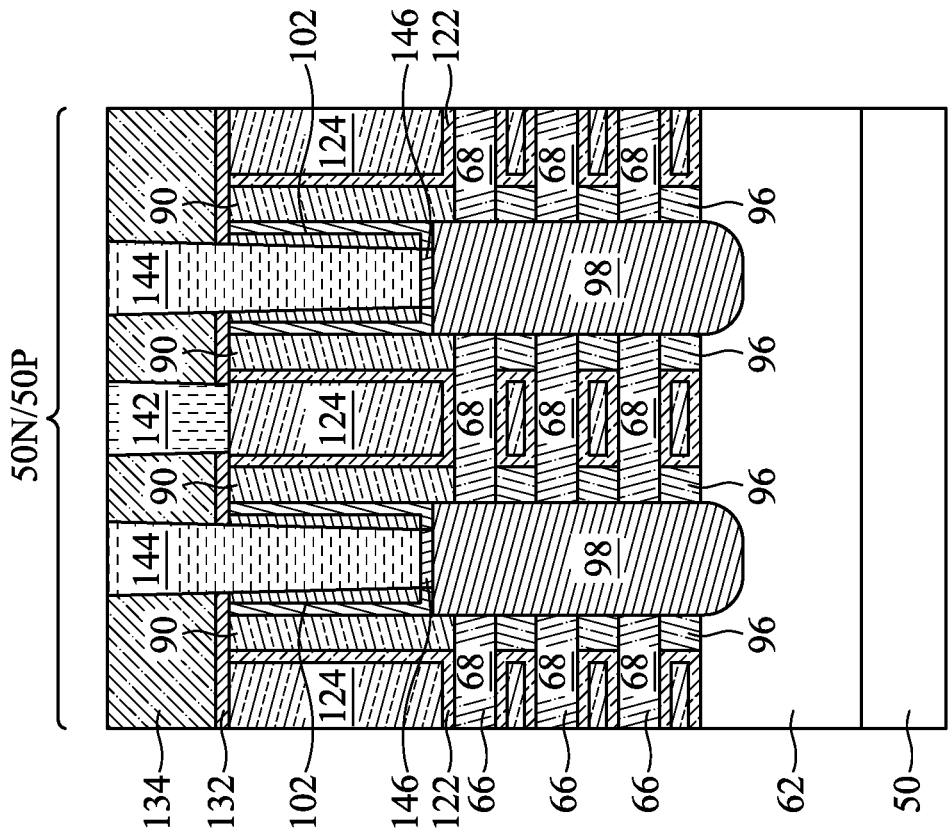
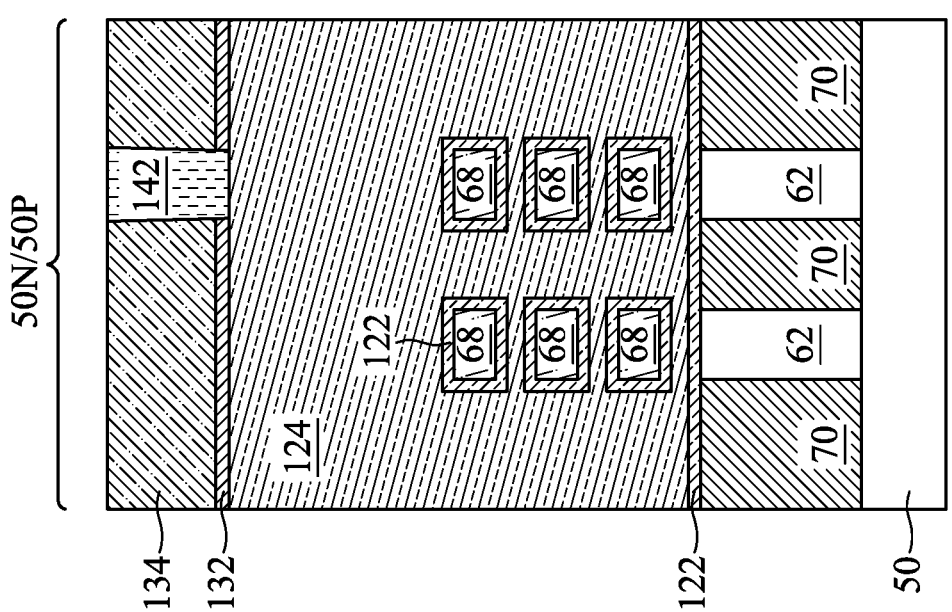
Figure 20B
Figure 20A

SEMICONDUCTOR DEVICE AND METHOD

PRIORITY CLAIM AND CROSS-REFERENCE

This application claims the benefit of U.S. Provisional Application No. 63/150,733, filed on Feb. 18, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6-20B are views of intermediate stages in the manufacturing of nano-FETs, in accordance with some embodiments.

DETAILED DESCRIPTION

Figure 1:
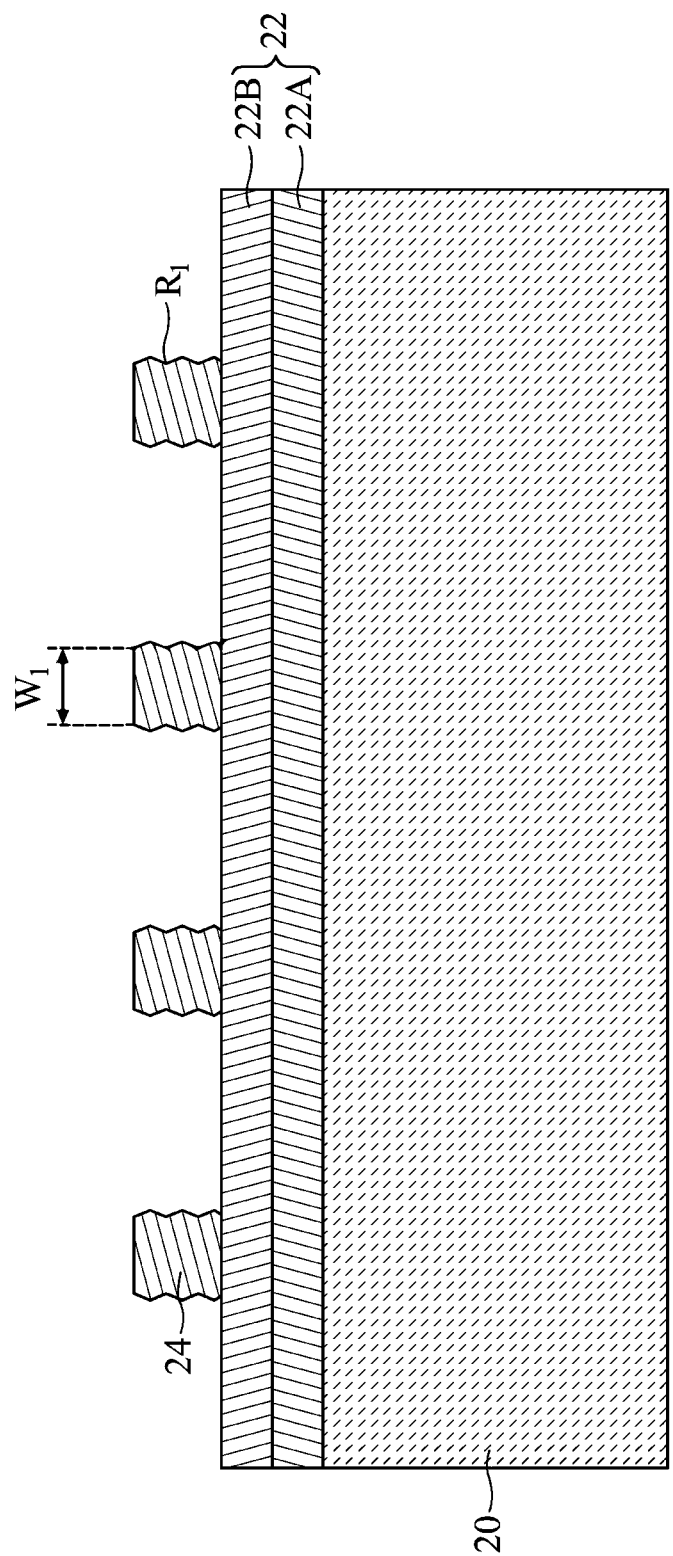
FIGS. 1-4 illustrate a process for patterning features in a substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a photoresist and a spacer layer are formed and used to pattern underlying features. The photoresist is patterned and the spacer layer is deposited on the sidewalls of the patterned photoresist. The spacer layer is deposited by a plasma-enhanced deposition process that has etching aspects and has deposition aspects. Specifically, the plasma-enhanced deposition process etches the sidewalls of the photoresist to decrease their roughness while also depositing the material of the spacer layer on those etched sidewalls. An etching mask with smooth sidewalls may thus be formed, thereby decreasing the line-width roughness of underlying features that are patterned using the etching mask.

FIGS. 1-4 illustrate a process for patterning features in a substrate, in accordance with some embodiments. The patterning process may be used to pattern any type of features in a substrate. For example, the patterning process may be used to pattern fins, nanostructures, gate structures, interconnects, and the like. The patterning process includes patterning a photoresist 24 (see FIG. 1) over the substrate 20 and then forming a spacer layer 26 (see FIG. 2) on sidewalls of the photoresist 24. The material of the spacer layer 26 is deposited by a plasma-enhanced deposition process 28 (see FIG. 2) that has etching aspects and has deposition aspects. Specifically, the plasma-enhanced deposition process 28 etches the sidewalls of the photoresist 24 to decrease their roughness while depositing the material of the spacer layer 26 on those etched sidewalls. The spacer layer 26 may be patterned to form spacers 30 (see FIG. 3), and the substrate 20 is etched using the spacers 30 and the photoresist 24 as a combined etching mask 34 to form patterned features 36 (see FIG. 4). Decreasing the roughness of the sidewalls of the photoresist 24 and depositing a spacer layer 26 on those etched sidewalls forms an etching mask 34 with smooth sidewalls, which decreases the line-width roughness of the patterned features 36. Manufacturing yield may thus be improved.

In FIG. 1, one or more masking layer(s) 22 are formed on a substrate 20, and a photoresist 24 is formed on the masking layer(s) 22. As will be subsequently described in greater detail, the substrate 20 may be any type of target layer, such as a semiconductor substrate, a conductive layer, a dielectric layer, or the like. The masking layer(s) 22 are optional, and their inclusion can help decrease the size of underlying features patterned using the photoresist 24.

In the illustrated embodiment, the masking layer(s) 22 are a multi-layer structure including a lower masking layer 22A and an upper masking layer 22B. The lower masking layer 22A is formed of a material that has a high etching selectivity from the etching of the substrate 20. For example, the lower masking layer 22A may be formed of a material that includes a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like), which may be formed by a deposition process such as chemical vapor deposition (CVD), ALD, or the like. The upper masking layer 22B is formed of a material that has a high etching selectivity from the etching of the lower masking layer 22A. For example, the upper masking layer 22B may be formed of silicon oxide, such as an undoped tetraethylorthosilicate (TEOS) oxide or a borophosphorous tetraethylortho silicate (BPTEOS) oxide, which may be formed by a deposition process such as chemical vapor deposition (CVD), ALD, or the like. Other acceptable materials formed by any acceptable process may be used. In some embodiments, a single masking layer 22 is used.

The photoresist 24 can be any acceptable photoresist that includes a photosensitive material, such as a single-layer photoresist, a bi-layer photoresist, a tri-layer photoresist, or the like. In some embodiments, the photoresist 24 is a tri-layer photoresist including a bottom layer (e.g., a bottom anti-reflective coating (BARC) layer), a middle layer (e.g., a nitride, an oxide, an oxynitride, or the like), and a top layer (e.g., a photosensitive material). The type of photoresist used may depend on the photolithography technique that will be used to pattern the photoresist 24. The layer(s) of the photoresist 24 may be formed by spin coating, a deposition process such as CVD, combinations thereof, or the like.

The photoresist 24 is patterned using acceptable photolithography techniques to form openings in the photoresist 24. The photoresist 24 can be patterned by exposing the photosensitive material of the photoresist 24 to a patterned energy source (e.g., a patterned light source) having a pattern of the openings so as to induce a chemical reaction, thus inducing a physical change in those portions of the photoresist 24 exposed to the patterned energy source. In embodiments where the photoresist 24 includes multiple layers (e.g., when the photoresist 24 is a bi-layer photoresist, a tri-layer photoresist, or the like), the top layer (e.g., the photosensitive material) of the photoresist 24 is exposed to the patterned energy source. The photoresist 24 can then be developed by applying a developer to the exposed photoresist to take advantage of the physical changes and selectively remove either the exposed portion of the photoresist 24 or the unexposed portion of the photoresist 24, depending upon the desired pattern.

In some embodiments, the photoresist 24 is patterned using next-generation lithography techniques such as extreme ultraviolet (EUV) lithography, deep ultraviolet (DUV) lithography, X-ray lithography, soft X-ray (SX) lithography, ion beam projection lithography, electron-beam projection lithography, or the like. The use of next-generation lithography techniques may allow the underlying features to be patterned by a single-patterning photolithography process, obviating the use of multiple-patterning photolithography processes and reducing manufacturing complexity/costs.

The use of next-generation lithography techniques allows the photoresist 24 to be patterned into features that have small dimensions. For example, after the photoresist 24 is patterned by a single-patterning photolithography process, the features of the photoresist 24 can have an average width $W_1$ in the range of 5 nm to 100 nm. Feature density may thus be improved. However, when the photoresist 24 is patterned by a single-patterning photolithography process, polymer aggregation in the photosensitive material of the photoresist 24 can cause the sidewalls of the photoresist 24 to be rough. For example, after the photoresist 24 is patterned by a single-patterning photolithography process, the sidewalls of the photoresist 24 can have a line-width roughness $R_1$ in the range of 3 nm to 8 nm. As will be subsequently described in greater detail, the photoresist 24 will be etched to reduce the roughness of its sidewalls. In this context, the "sidewalls" of the photoresist 24 are the surfaces of the photoresist 24 that are perpendicular to a major surface of the substrate 20.

Figure 2:
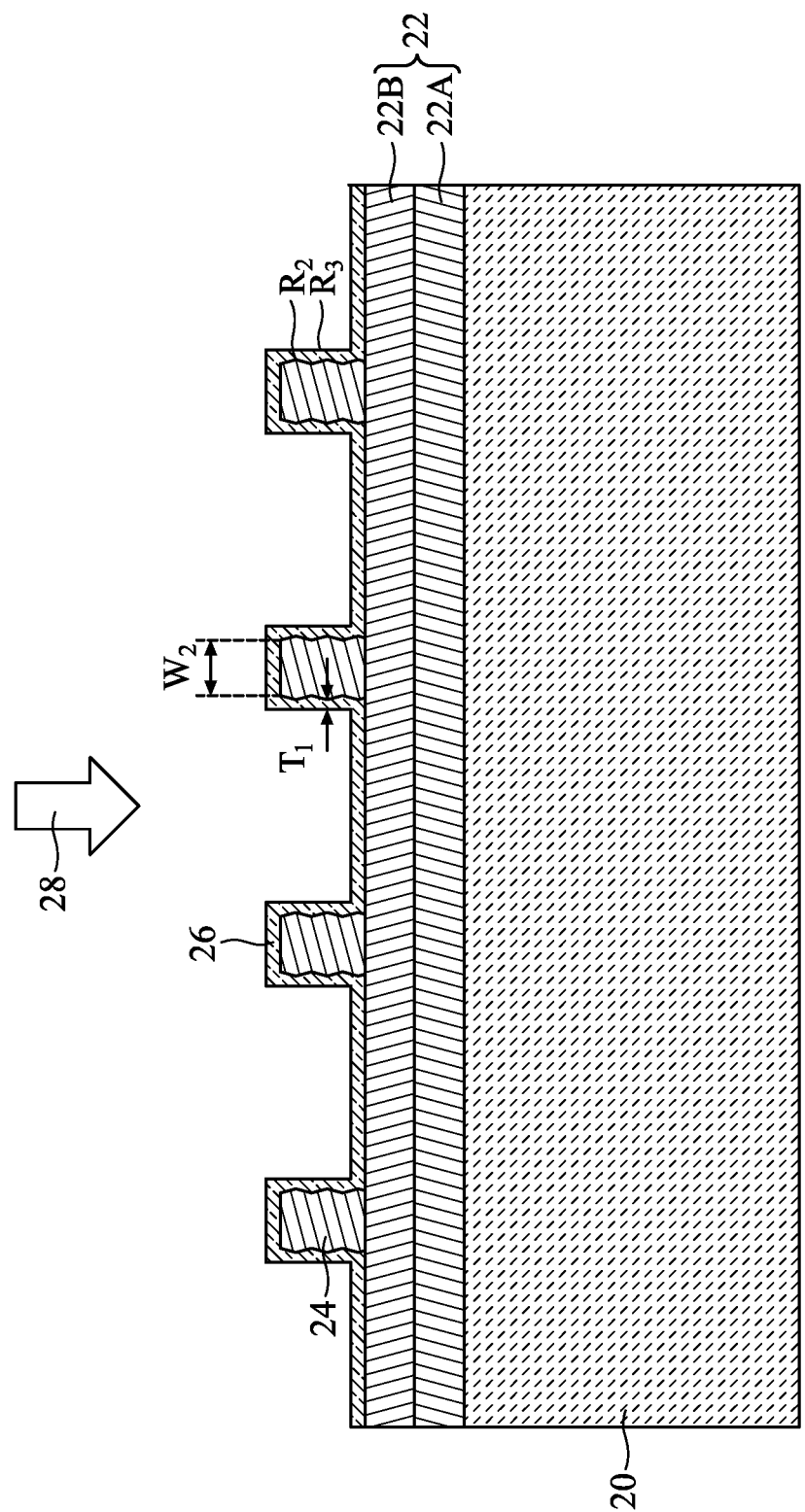

In FIG. 2, a spacer layer 26 is formed on the top surfaces and sidewalls of the patterned features of the photoresist 24. In embodiments where the photoresist 24 includes multiple layers (e.g., when the photoresist 24 is a bi-layer photoresist, a tri-layer photoresist, or the like), the spacer layer 26 is formed on the top surfaces and sidewalls of the top layer (e.g., the photosensitive material) of the photoresist 24. The spacer layer 26 is formed of a spacer material that has a high etching selectivity from the etching of the substrate 20. For example, the spacer layer 26 may be formed of an oxide such as silicon oxide, a tetraethylorthosilicate (TEOS) based oxide, or the like, which may be deposited by a conformal deposition process such as atomic layer deposition (ALD), plasma-enhanced atomic layer deposition (PEALD), chemical vapor deposition (CVD), plasma-enhanced chemical vapor deposition (PECVD), or the like.

In some embodiments, the spacer layer 26 is an oxide layer formed by a plasma-enhanced deposition process 28 such as PEALD. For example, the spacer layer 26 can be formed of silicon oxide. The plasma-enhanced deposition process 28 for forming the spacer layer 26 has etching aspects and has deposition aspects. Specifically, the plasma-enhanced deposition process 28 etches the sidewalls of the photoresist 24 while depositing the material of the spacer layer 26.

The etching aspects of the plasma-enhanced deposition process 28 reduce the roughness of the sidewalls of the photoresist 24. For example, after the photoresist 24 is etched by the plasma-enhanced deposition process 28, the sidewalls of the photoresist 24 can have a line-width roughness $R_2$ in the range of 1.5 nm to 4 nm. The line-width roughness $R_2$ is less than the line-width roughness $R_1$. For example, the line-width roughness $R_2$ can be from 30% to 80% of the line-width roughness $R_1$. The etching aspects of the plasma-enhanced deposition process 28 also reduce the dimensions of the photoresist 24. For example, after the photoresist 24 is etched by the plasma-enhanced deposition process 28, the features of the photoresist 24 can have an average width $W_2$ in the range of 15 nm to 80 nm. The width $W_2$ is less than the width $W_1$. For example, the width $W_2$ can be from 30% to 80% of the width $W_1$.

The deposition aspects of the plasma-enhanced deposition process 28 form the material of the spacer layer 26 on the top surfaces and sidewalls of the photoresist 24. The spacer layer 26 is deposited to a sufficient thickness that (in combination with the etching of the sidewalls of the photoresist 24) allows the sidewalls of the spacer layer 26 to be smooth. For example, the spacer layer 26 can be deposited to a thickness $T_1$ in the range of 0.5 nm to 8 nm, and the sidewalls of the spacer layer 26 can have a line-width roughness $R_3$ in the range of 1.5 nm to 2.8 nm. The line-width roughness $R_3$ is less than the line-width roughness $R_2$. For example, the line-width roughness $R_3$ can be from 30% to 90% less than the line-width roughness $R_2$. As will be subsequently described in greater detail, the spacer layer 26 and the photoresist 24 will be used as a combined etching mask to pattern underlying features, and forming the spacer layer 26 with smooth sidewalls allows the sidewalls of the combined etching mask to be smooth. Manufacturing yield may thus be improved. Further, forming the spacer layer 26 to a sufficient thickness allows for the compensation of losses from the etching of the photoresist 24. The features of the combined etching mask that will be used to pattern underlying features may thus have sufficient dimensions.

The plasma-enhanced deposition process 28 is performed by placing the substrate 20 in a deposition chamber and cyclically dispensing different source precursors into the deposition chamber. A plasma is generated during at least a portion of each ALD cycle. The source precursors include a first precursor and a second precursor. The first precursor and the second precursor are any acceptable precursors that can react to deposit the material of the spacer layer 26, and the second precursor is also a precursor that can act as an ion source for generating a plasma. For example, when the spacer layer 26 is formed of silicon oxide, the first precursor can be a silicon-containing precursor and the second precursor can be an oxygen-containing precursor. Acceptable silicon-containing precursors for depositing silicon oxide include binary silicon-hydrogen compound silanes such as silane ($SiH_4$), disilane ($Si_2H_6$), and the like. Acceptable oxygen-containing precursors for depositing silicon oxide and generating a plasma include oxygen gas ($O_2$), ozone ($O_3$), and the like. Other acceptable precursors may be used.

A first pulse of an ALD cycle is performed by dispensing the first precursor (e.g., a silicon-containing precursor) into the deposition chamber, so that the photoresist 24 is exposed to the first precursor. The first pulse is performed at a low temperature. In some embodiment, the first pulse is performed at a temperature of less than 120° C., such as a temperature in the range of room temperature (e.g., about 20° C.) to 120° C., e.g., by maintaining the deposition chamber at such a temperature. The first pulse can be performed at a pressure in the range of 1 Torr to 5 Torr, e.g., by maintaining the deposition chamber at such a pressure. The first pulse can be performed for a duration in the range of 1 minute to 5 minutes, e.g., by keeping the first precursor in the deposition chamber for such a duration. The first precursor is then purged from the deposition chamber, such as by any acceptable vacuuming process and/or by flowing an inert gas into the deposition chamber.

A second pulse of the ALD cycle is performed by dispensing the second precursor (e.g., an oxygen-containing precursor) into the deposition chamber, so that the photoresist 24 is exposed to the second precursor. The second pulse is performed at a low temperature. In some embodiment, the second pulse is performed at a temperature of less than 120° C., such as a temperature in the range of room temperature (e.g., about 20° C.) to 120° C., e.g., by maintaining the deposition chamber at such a temperature. The second pulse can be performed at a pressure in the range of 1 Torr to 5 Torr, e.g., by maintaining the deposition chamber at such a pressure. The second pulse can be performed for a duration in the range of 1 minute to 5 minutes, e.g., by keeping the second precursor in the deposition chamber for such a duration. The second precursor is then purged from the deposition chamber, such as by any acceptable vacuuming process and/or by flowing an inert gas into the deposition chamber.

During the second pulse of the ALD cycle, a plasma is generated in the deposition chamber. Generating the plasma increases the reactivity of the second precursor with the first precursor, thereby allowing the second pulse to be performed at a temperature (previously described) that is low. Damage to the photoresist 24 may be avoided by processing at a low temperature. Generating the plasma also etches the material of the photoresist 24. Specifically, the second precursor is a gas that, during generation of the plasma, performs etching that is selective to the photoresist 24 (e.g., selectively etches the material of the photoresist 24 at a faster rate than the material(s) of underlying layers, such as the masking layer(s) 22).

The plasma can be generated during the second pulse of the ALD cycle by flowing a gas source into the deposition chamber, and using a plasma generator to excite the gas source into a plasma state. The gas source includes the second precursor, and may include a carrier gas (such as hydrogen, helium, neon, argon, krypton, xenon, radon, or the like). The gas source can be flowed into the deposition chamber at a flow rate in the range of 0 L/min to 6 L/min. The plasma generator may be a capacitively coupled plasma (CCP) generator, an inductively coupled plasma (ICP) generator, a remote plasma generator, or the like. Radio frequency (RF) power is generated by the plasma generator to excite the gas source into a plasma state. The plasma generation power is pulsed between a low power and a high power during the second pulse of the ALD cycle. The plasma generation power can have a pulse frequency in the range of 40 kHz to 60 MHz. The plasma generation power can have a high power in the range of 15 watts to 800 watts. Performing the plasma generation at less than 15 watts (under the other deposition parameters described herein) may not sufficiently activate the gas source to a plasma. Performing the plasma generation at more than 800 watts (under the other deposition parameters described herein) may result in damage to the photoresist 24.

Each ALD cycle results in the deposition of an atomic layer (sometimes called a monolayer) of the material of the spacer layer 26. When the spacer layer 26 is formed of silicon oxide, each monolayer can have a thickness of 1 Å. The ALD cycles are repeated a number of times until the material of the spacer layer 26 is deposited to a desired thickness (previously described). For example, the ALD cycles can be repeated from 1 to 500 times.

Figure 3:
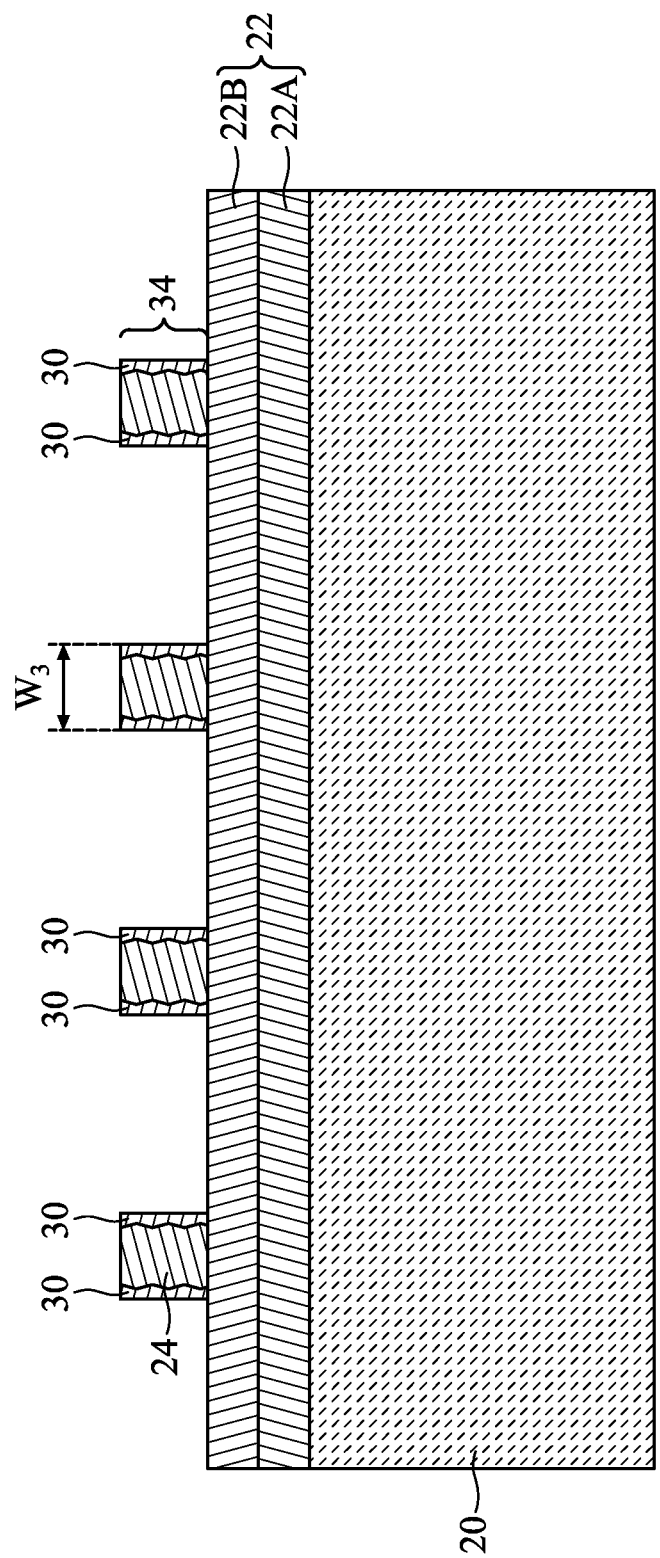

In FIG. 3, the spacer layer 26 is patterned to form spacers 30. A suitable etching process is performed to remove the horizontal portions of the spacer layer 26. The etching process selectively etches the horizontal portions of the spacer layer 26 at a faster rate than the photoresist 24 and the vertical portions of the spacer layer 26. During the plasma-enhanced deposition process 28 (previously described), the top/bottom portions of the spacer layer 26 become weaker than the sidewall portions of the spacer layer 26 by plasma bombardment in a vertical direction. The weakened portions (e.g., the horizontal portions of the spacer layer 26) are selectively etched at a faster rate than the unweakened portions (e.g., the vertical portions of the spacer layer 26). For example, when the spacer layer 26 is formed of silicon oxide, the etching process can be an anisotropic dry etch performed with a halogen-based etchant that includes fluorine (F), chlorine (Cl), bromine (Br), or the like. After the etching process, the spacers 30 include the remaining vertical portions of the spacer layer 26. The photoresist 24 remains after the spacers 30 are formed.

The spacers 30 and the photoresist 24 together form a combined etching mask 34. Because the sidewalls of the spacer layer 26 are smooth, the outer sidewalls of the spacers 30 are also smooth. The outer sidewalls of the spacers 30 are also the outer sidewalls of the combined etching mask 34. Therefore, the outer sidewalls of the combined etching mask 34 are also smooth, and may have the same line-width roughness as the spacer layer 26. The underlying features patterned using the combined etching mask 34 can thus have sidewalls that are smooth.

As previously noted, the spacer layer 26 is formed to a thickness that allows for the compensation of losses from the etching of the photoresist 24. The features of the combined etching mask 34 can have an average width $W_3$ in the range of 15 nm to 80 nm. The width $W_3$ is greater than the width $W_2$. For example, the width $W_3$ can be from 30% to 80% greater than the width $W_2$.

Figure 4:
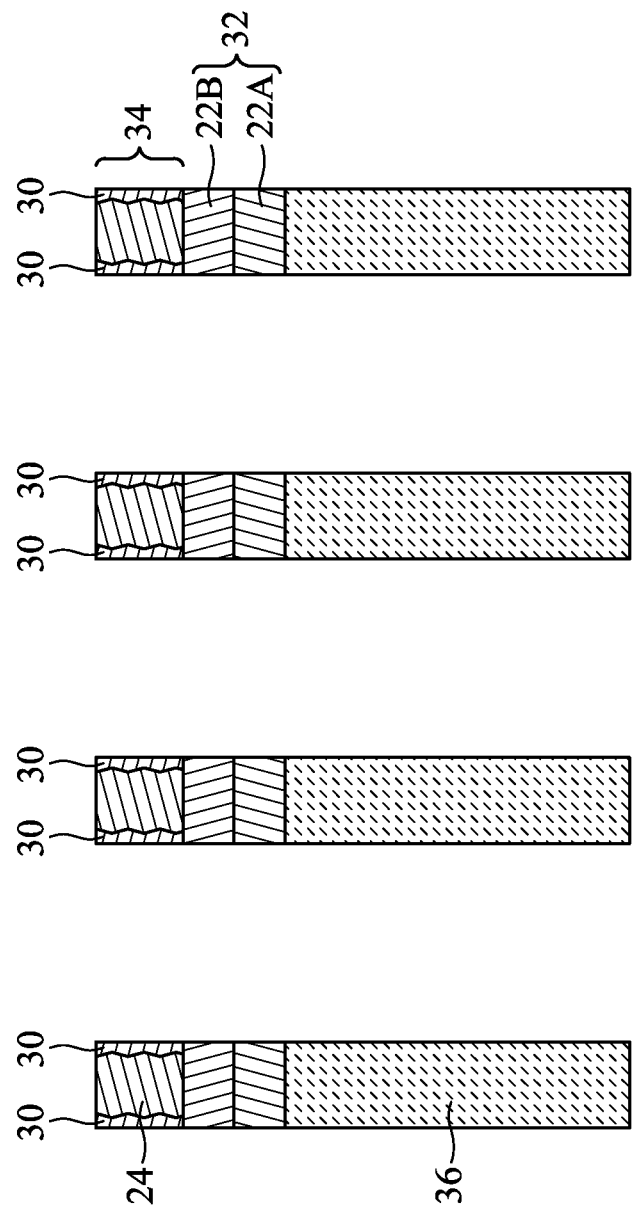

In FIG. 4, the substrate 20 is etched using the spacers 30 and the photoresist 24 as a combined etching mask 34 to form patterned features 36. The etching transfers the pattern of the combined etching mask 34 (e.g., the spacers 30 and the photoresist 24) to the substrate 20, and may include any acceptable etching technique. The etching process may be anisotropic. The spacers 30 and the photoresist 24 can be removed during the etching of the substrate 20, or can be subsequently removed by any suitable cleaning process. Because the outer sidewalls of the combined etching mask 34 are smooth, the patterned features 36 thus also have sidewalls that are smooth.

In embodiments where the masking layer(s) 22 are formed, etching the substrate 20 includes transferring the pattern of the combined etching mask 34 to the masking layer(s) 22 to form a mask 32, and then transferring the pattern of the mask 32 to the substrate 20. The etching process can include one or more etching step(s) that are selective to the masking layer(s) 22 (e.g., selectively etches the material(s) of the masking layer(s) 22 at a faster rate than the material(s) of the substrate 20). For example, when the masking layer(s) 22 are a multi-layer structure, a first etching step may be performed to pattern the upper masking layer 22B, and a second etching step may be performed to pattern the lower masking layer 22A. In embodiments where the masking layer(s) 22 are formed of a metal or a nitride, the mask 32 may be referred to as a hard mask. The substrate 20 is patterned using the mask 32 as an etching mask.

Although FIGS. 3-4 illustrate discrete etching processes, they may be steps of a same etching process. For example, after the spacer layer 26 (see FIG. 2) is formed, a single continuous etching step may be performed to pattern the substrate 20. During such a continuous etching step, the spacers 30 (see FIG. 3) transiently formed, and the continuous etching step is performed until the patterned features 36 (see FIG. 4) are formed. For example, if the continuous etching step is anisotropic, the horizontal portions of the spacer layer 26 may be etched at a faster rate than the vertical portions of the spacer layer 26 so that the spacers 30 are transiently formed.

Some embodiments contemplate variations of the patterning process described for FIGS. 1-4. For example, the masking layer(s) 22 may be omitted so that the combined etching mask 34 is used to directly pattern the substrate 20. Fewer or additional spacers and/or mask layers may be used when desired.

As previously noted, the patterning process described for FIGS. 1-4 may be used to pattern any type of features in a substrate. In some embodiments, the patterning process is used to pattern features for transistors. Embodiments are described in a particular context, a die including nano-FETs. Various embodiments may be applied, however, to dies including other types of transistors (e.g., fin field-effect transistors (finFETs), planar transistors, or the like) in lieu of or in combination with the nano-FETs.

Figure 5:
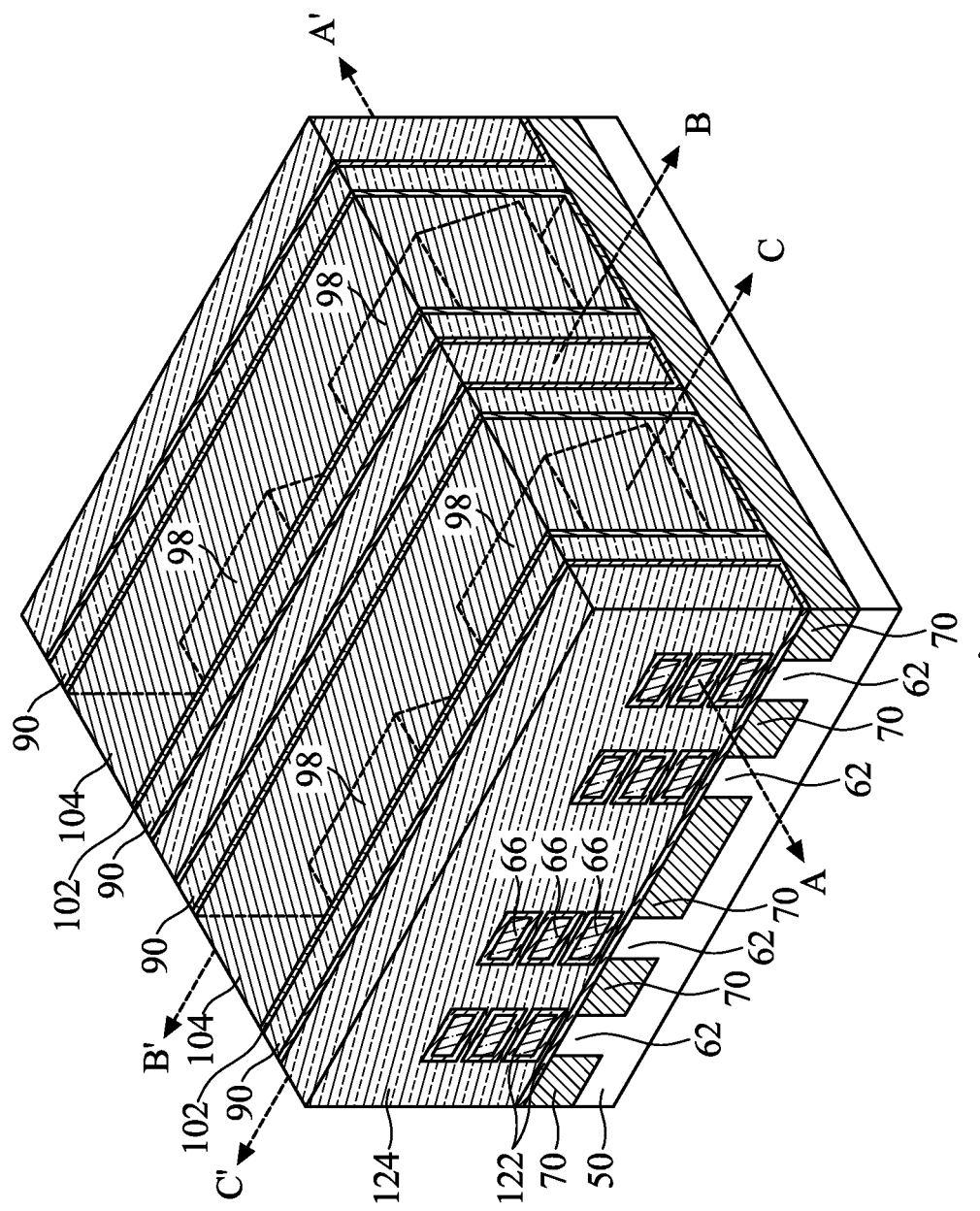
FIG. 5 illustrates an example of a nanostructure field-effect transistor (nano-FET) in a three-dimensional view, in accordance with some embodiments.

FIG. 5 illustrates an example of nano-FETs (e.g., nanowire FETs, nanosheet FETs, or the like), in accordance with some embodiments. FIG. 5 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are over top surfaces of the fins 62 and along top surfaces, sidewalls, and bottom surfaces of the nanostructures 66. Gate electrodes 124 are over the gate dielectrics 122. Epitaxial source/drain regions 98 are disposed on the fins 62 at opposing sides of the gate dielectrics 122 and the gate electrodes 124. An inter-layer dielectric (ILD) 104 is formed over the epitaxial source/drain regions 98. A contact etch stop layer (CESL) 102 is optionally formed between the ILD 104 and the epitaxial source/drain regions 98. Source/drain contacts (subsequently described) to the epitaxial source/drain regions 98 are formed through the CESL 102 and the ILD 104. The epitaxial source/drain regions 98 may be shared between various nanostructures 66 and fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 5 further illustrates reference cross-sections that are used in later figures. Cross-section A-A' is along a longitudinal axis of a gate electrode 124 and in a direction, for example, perpendicular to a direction of current flow between the epitaxial source/drain regions 98 of a nano-FET. Cross-section B-B' is along a longitudinal axis of a fin 62 and in a direction of, for example, a current flow between the epitaxial source/drain regions 98 of the nano-FET. Cross-section C-C' is parallel to cross-section A-A' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (finFETs). For example, finFETs may include fins on a substrate, with the fins acting as channel regions for the finFETs. Similarly, planar FETs may include a substrate, with portions of the substrate acting as channel regions for the planar FETs.

FIGS. 6-20B are views of intermediate stages in the manufacturing of nano-FETs, in accordance with some embodiments. FIGS. 6, 7, 8, 9, and 10 are three-dimensional views showing a similar three-dimensional view as FIG. 5.

Figure 13C:
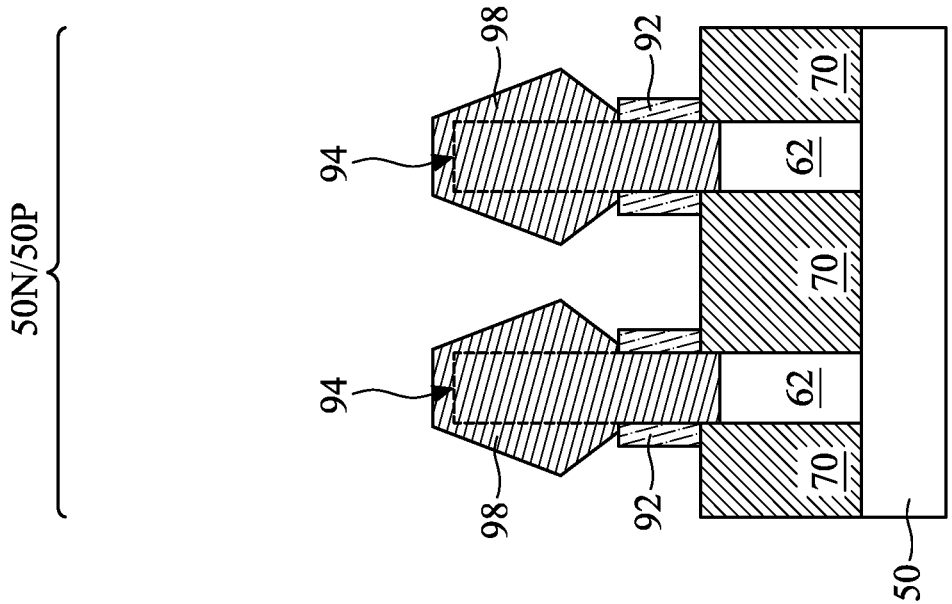
Figure 13D:
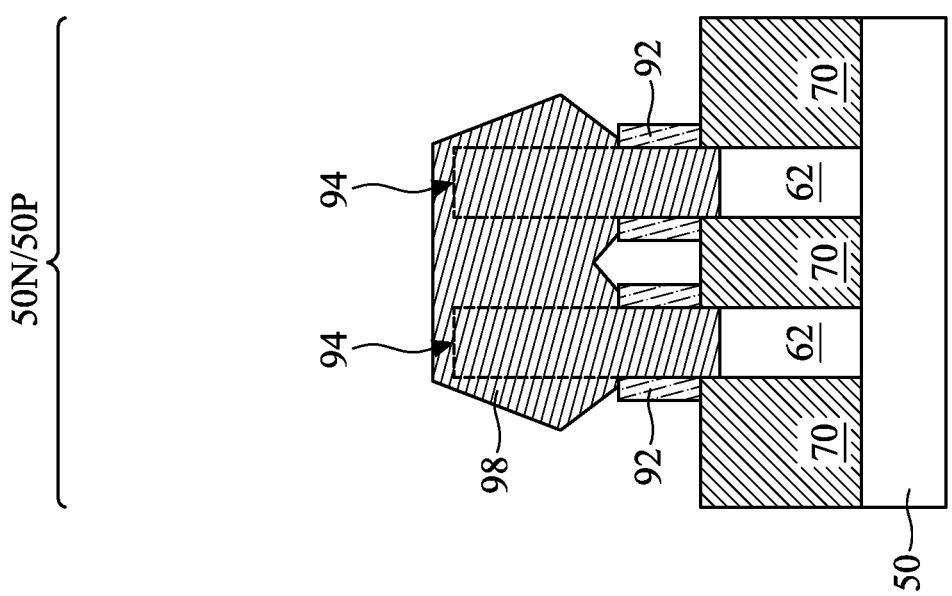

FIGS. 11A, 12A, 13A, 14A, 15A, 16A, 17A, 18A, 19A, and 20A illustrate reference cross-section A-A' illustrated in FIG. 5. FIGS. 11B, 12B, 13B, 14B, 15B, 16B, 17B, 18B, 19B, and 20B illustrate reference cross-section B-B' illustrated in FIG. 5. FIGS. 13C and 13D illustrate reference cross-section C-C' illustrated in FIG. 5.

Figure 6:
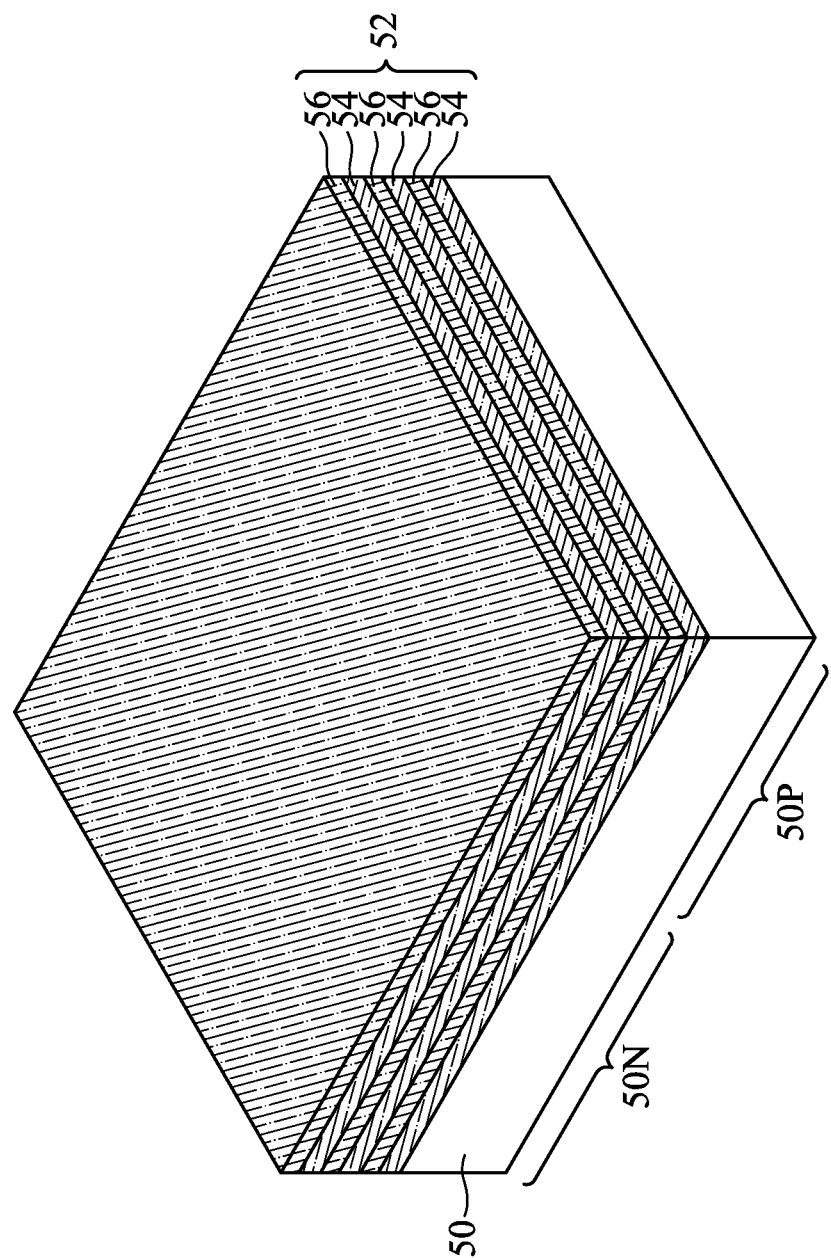

In FIG. 6, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region may be in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of 5 nm to 30 nm. In some embodiments, some layers (e.g., the second semiconductor layers 56) are formed to be thinner than other layers (e.g., the first semiconductor layers 54). For example, in embodiments in which the first semiconductor layers 54 are sacrificial layers (or dummy layers) and the second semiconductor layers 56 are patterned to form channel regions for the nano-FETs in both the n-type region 50N and the p-type region 50P, the first semiconductor layers 54 can have a first thickness and the second semiconductor layers 56 can have a second thickness, with the second thickness being from 30% to 60% less than the first thickness. Forming the second semiconductor layers 56 to a smaller thickness allows the channel regions to be formed at a greater density.

Figure 7:
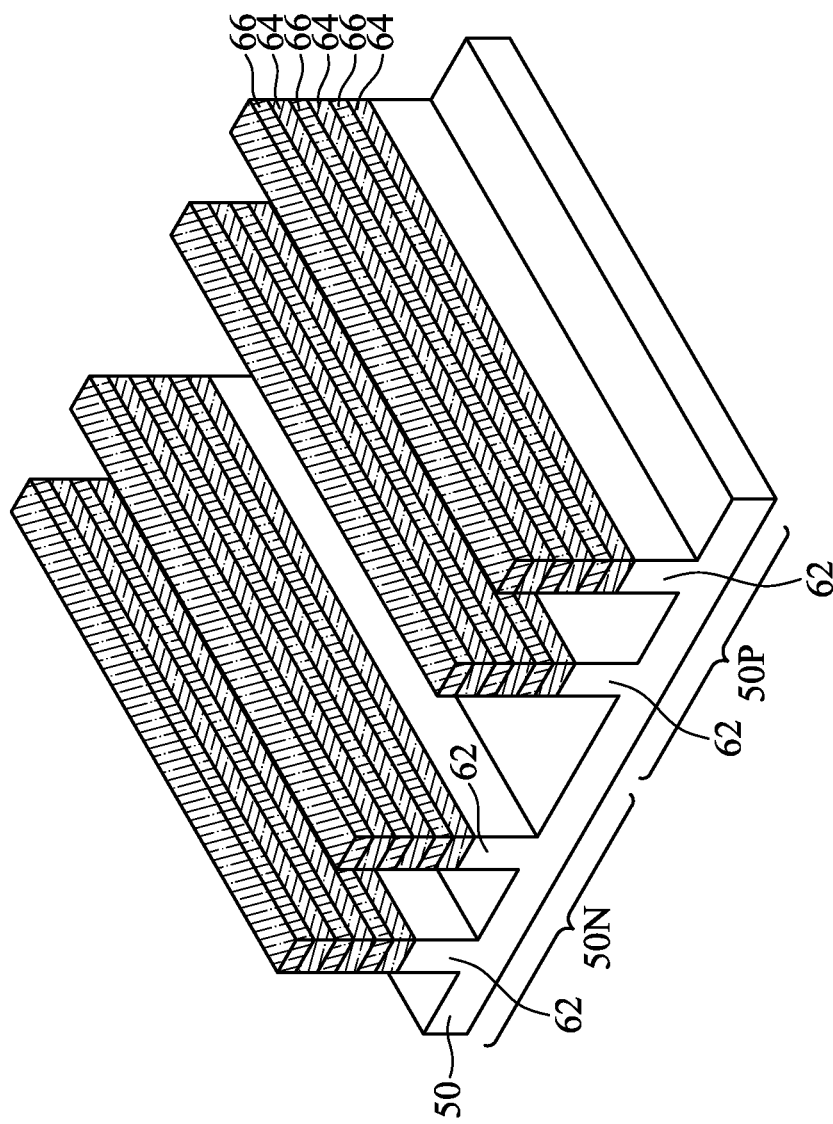

In FIG. 7, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The patterning process described for FIGS. 1-4 may be used to pattern the trenches in the substrate 50 and the multi-layer stack 52. For example, as illustrated by FIGS. 22-25, the mask layer(s) 22 and/or the photoresist 24 (see FIG. 22) can be formed on the multi-layer stack 52. The spacer layer 26 (see FIG. 23) can be formed on the top surfaces and sidewalls of the patterned features of the photoresist 24 by a plasma-enhanced deposition process 28 (see FIG. 23) that also smooths the sidewalls of the photoresist 24. The spacers 30 (see FIG. 24) can be formed on the sidewalls of the photoresist 24 by patterning the spacer layer 26. The substrate 50 and the multi-layer stack 52 can then be etched using the spacers 30 and the photoresist 24 as a combined etching mask 34 (see FIG. 25) to form the fins 62 and the nanostructures 64, 66, respectively. The line-width roughness of the fins 62 and the nanostructures 64, 66 may thus be reduced.

The fins 62 and the nanostructures 64, 66 may each have widths in a range of 8 nm to 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 8:
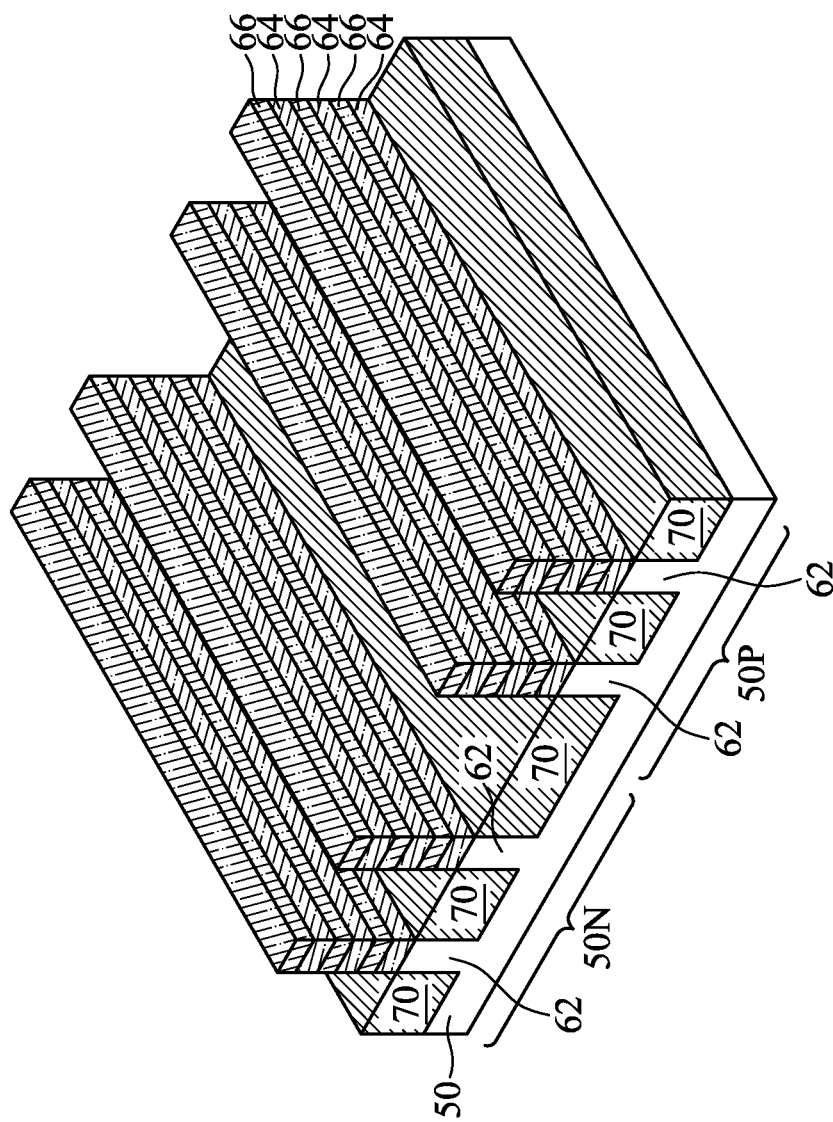

In FIG. 8, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent devices.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, no mask remains on the nanostructures 64, 66. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etching process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. The patterning process described for FIGS. 1-4 may be used to pattern the trenches in the dielectric layer. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 9:
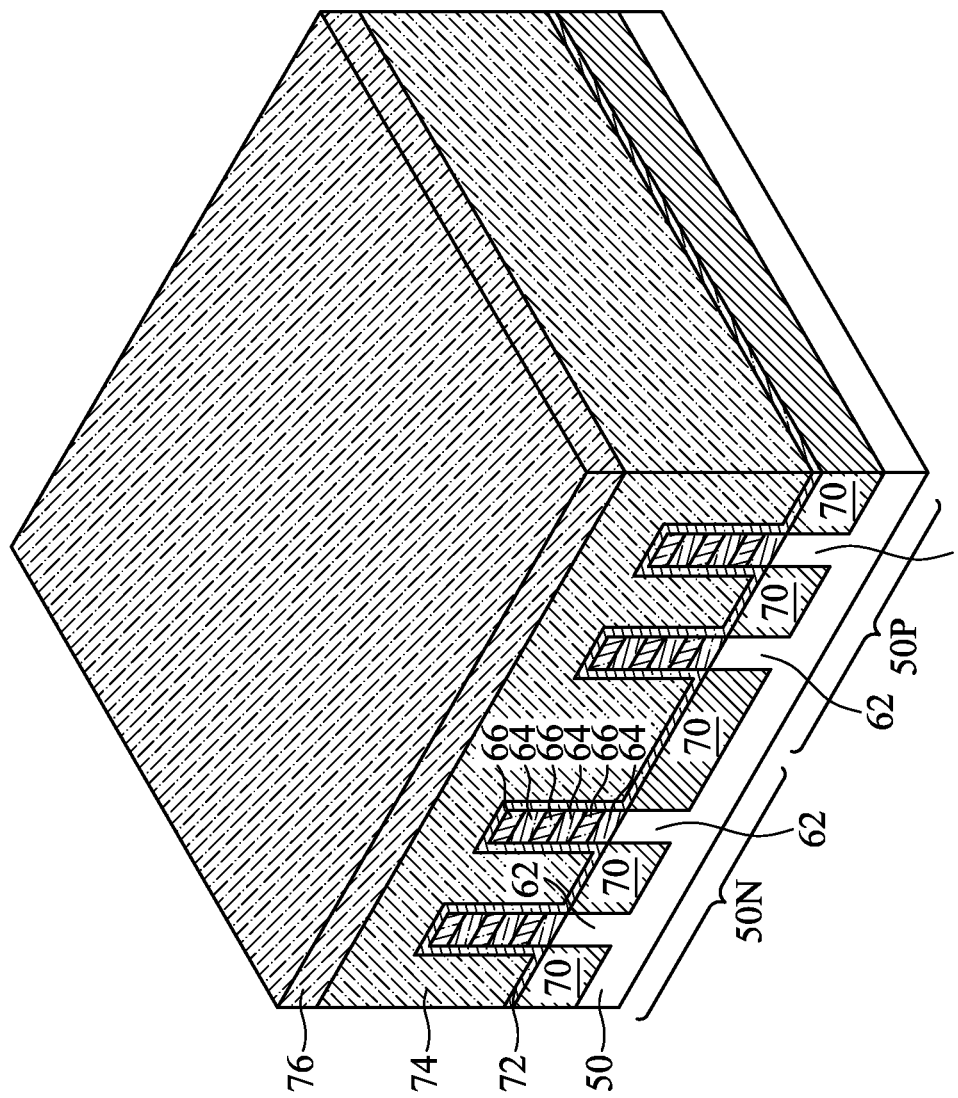

In FIG. 9, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 10:
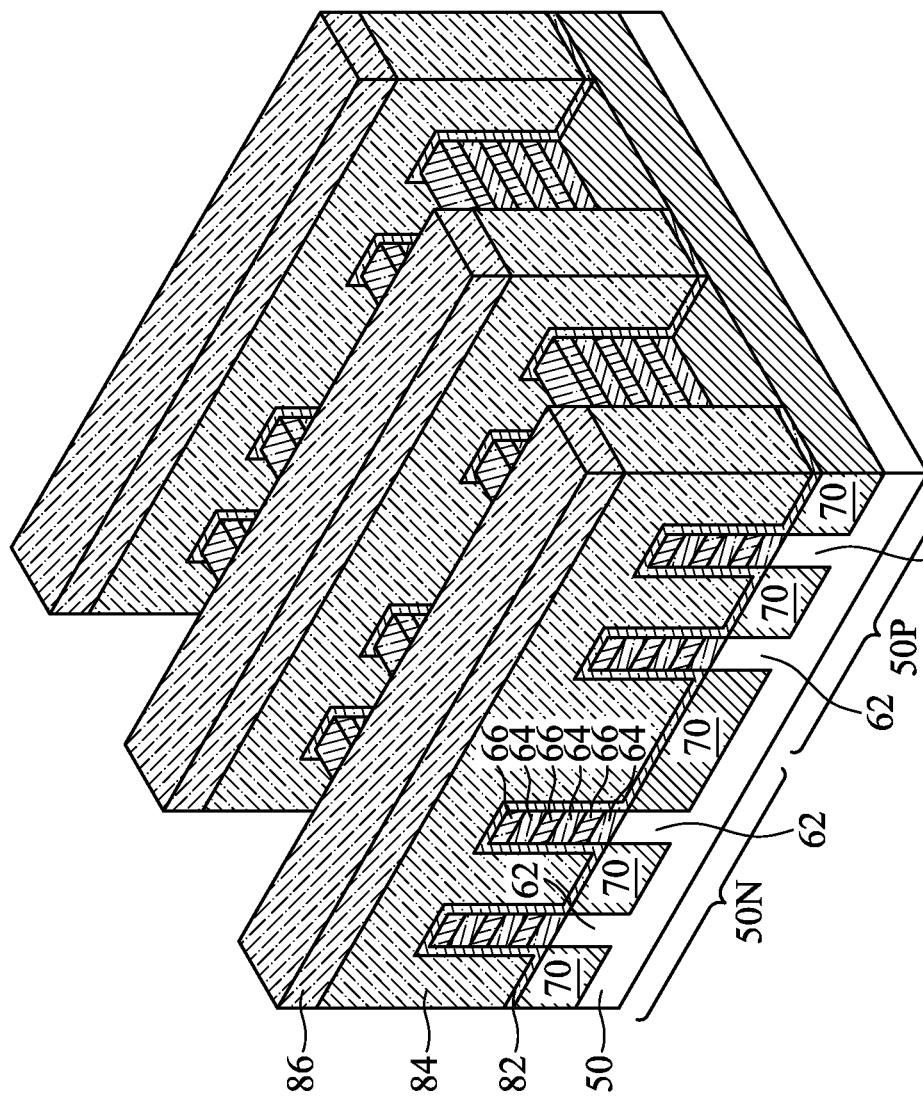

In FIG. 10, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

The patterning process described for FIGS. 1-4 may be used to pattern the dummy dielectric layer 72 and/or the dummy gate layer 74. For example, as illustrated by FIGS. 26-29, the mask layer(s) 22 and/or the photoresist 24 (see FIG. 26) can be formed on the dummy gate layer 74. The mask layer(s) 22 may act as the mask layer 76. The spacer layer 26 (see FIG. 27) can be formed on the top surfaces and sidewalls of the patterned features of the photoresist 24 by a plasma-enhanced deposition process 28 (see FIG. 27) that also smooths the sidewalls of the photoresist 24. The spacers 30 (see FIG. 28) can be formed on the sidewalls of the photoresist 24 by patterning the spacer layer 26. The dummy dielectric layer 72 and/or the dummy gate layer 74 can then be etched using the spacers 30 and the photoresist 24 as a combined etching mask 34 (see FIG. 29) to form the dummy dielectrics 82 and the dummy gates 84, respectively. The line-width roughness of the dummy dielectrics 82 and the dummy gates 84 may thus be reduced.

FIGS. 11A-20B illustrate various additional steps in the manufacturing of embodiment devices. FIGS. 11A-20B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

In FIGS. 11A and 11B, gate spacers 90 are formed over the nanostructures 64, 66, on exposed sidewalls of the masks 86 (if present), the dummy gates 84, and the dummy dielectrics 82. The gate spacers 90 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. In the illustrated embodiment, the gate spacers 90 each include multiple layers, e.g., a first spacer layer 90A and a second spacer layer 90B. In some embodiments, the first spacer layers 90A and the second spacer layers 90B are formed of silicon oxycarbonitride (e.g., $SiO_xN_yC_{1-x-y}$, where x and y are in the range of 0 to 1), with the first spacer layers 90A formed of a similar or a different composition of silicon oxycarbonitride than the second spacer layers 90B. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). As will be subsequently described in greater detail, the dielectric material(s), when etched, may also have portions left on the sidewalls of the fins 62 and/or the nanostructures 64, 66 (thus forming fin spacers 92, see FIGS. 13C and 13D). After etching, the fin spacers 92 and/or the gate spacers 90 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type (e.g., n-type) impurities may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

In FIGS. 12A and 12B, source/drain recesses 94 are formed in the nanostructures 64, 66. In the illustrated embodiment, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI regions 70; or the like. The source/drain recesses 94 may be formed by etching the nanostructures 64, 66 using an anisotropic etching processes, such as a RIE, a NBE, or the like. The gate spacers 90 and the dummy gates 84 collectively mask portions of the fins 62 and/or the nanostructures 64, 66 during the etching processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by any acceptable etching process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first nanostructures 64. The inner spacers 96 can then be formed by conformally forming an insulating material and subsequently etching the insulating material. The insulating material may be silicon nitride or silicon oxynitride, although any suitable material, such as low-k dielectric materials (e.g., dielectric materials having a k-value less than about 3.5), may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

In FIGS. 13A and 13B, epitaxial source/drain regions 98 are formed in the source/drain recesses 94. The epitaxial source/drain regions 98 are formed in the source/drain recesses 94 such that each dummy gate 84 (and corresponding channel regions 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type devices. For example, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type devices. For example, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 13C. In some embodiments, adjacent epitaxial source/drain regions 98 remain separated after the epitaxy process is completed as illustrated by FIG. 13D. In the illustrated embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 and/or the nanostructures 64, 66 that extend above the STI regions 70, thereby blocking the epitaxial growth. In another embodiment, the spacer etch used to form the gate spacers 90 is adjusted to not form fin spacers, so as to allow the epitaxial source/drain regions 98 to extend to the surface of the STI regions 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different impurity concentrations. In some embodiments, the liner layer 98A may have a lesser concentration of impurities than the main layer 98B, and the finishing layer 98C may have a greater concentration of impurities than the liner layer 98A and a lesser concentration of impurities than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 14B:
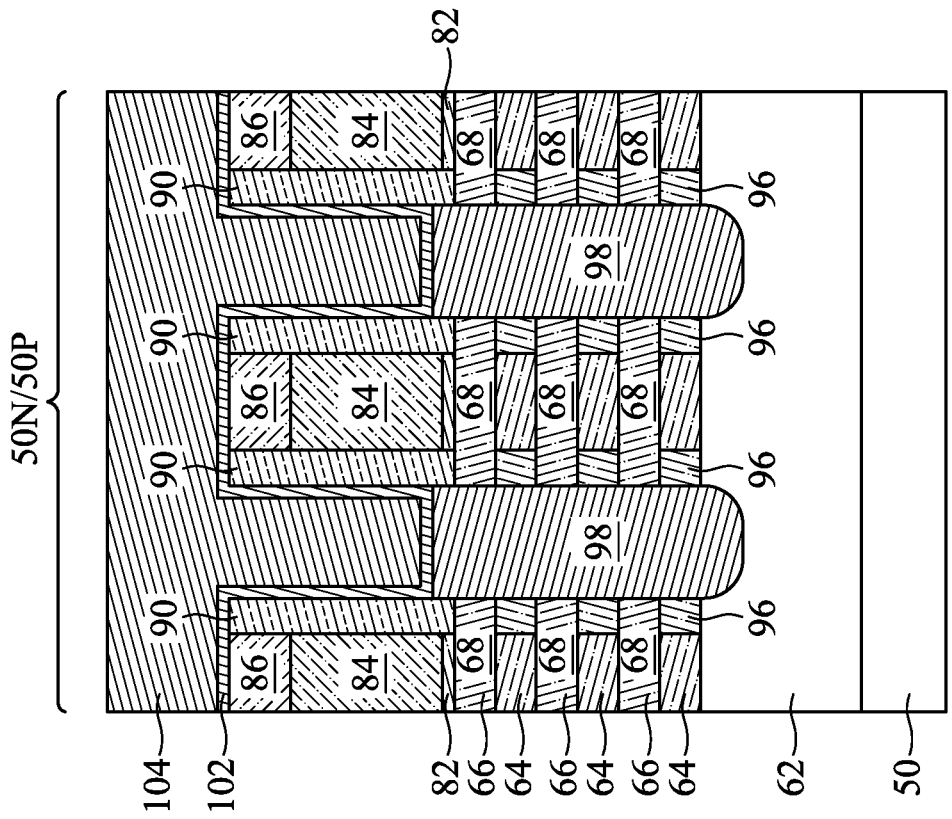
Figure 14A:
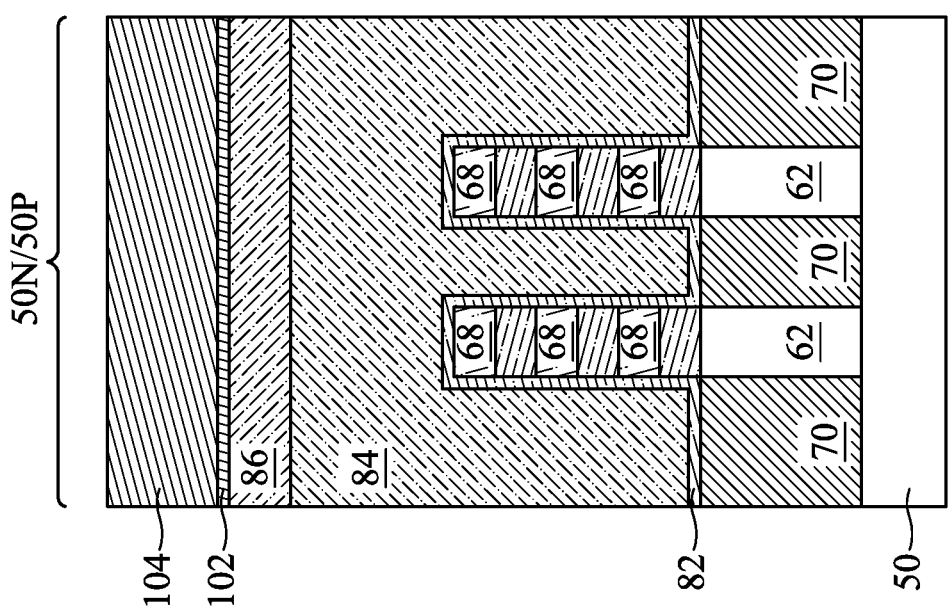

In FIGS. 14A-14B, a first ILD 104 is deposited over the epitaxial source/drain regions 98, the gate spacers 90, the masks 86 (if present) or the dummy gates 84. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a CESL 102 is formed between the first ILD 104 and the epitaxial source/drain regions 98, the gate spacers 90, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by an any suitable method, such as CVD, ALD, or the like.

Figure 15B:
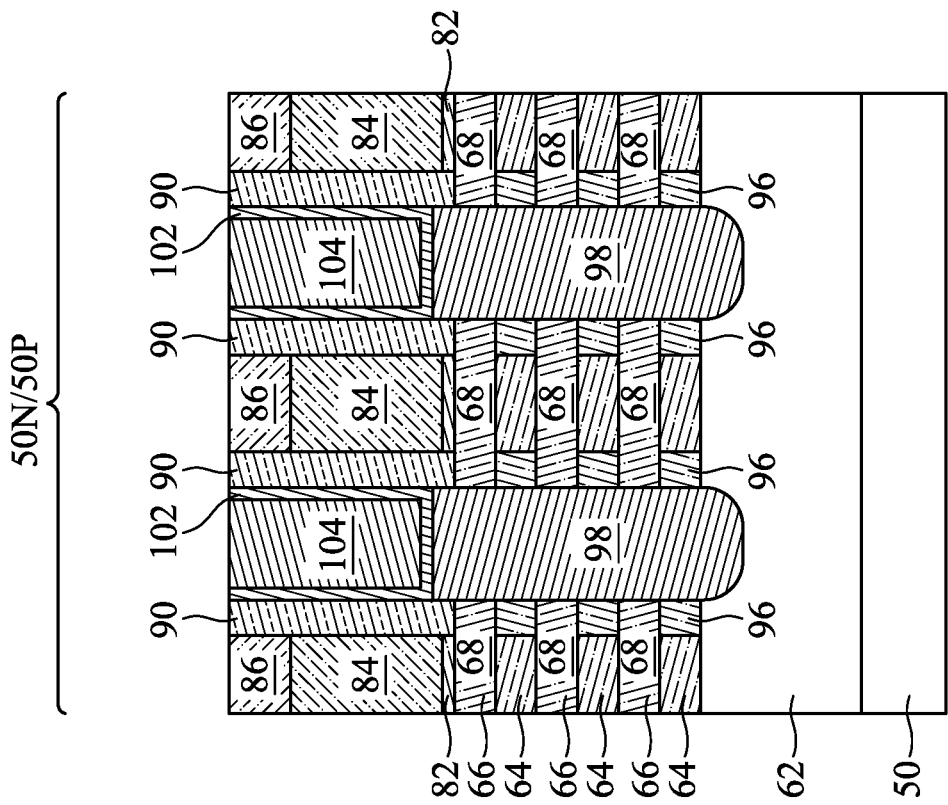
Figure 15A:
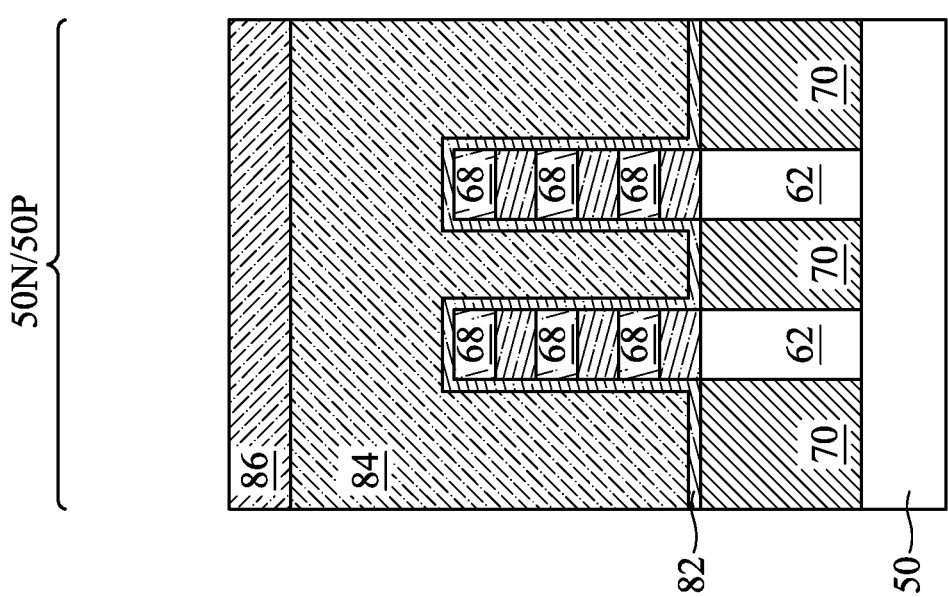

In FIGS. 15A-15B, a removal process is performed to level the top surfaces of the first ILD 104 with the top surfaces of the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figures 16A, 16B:
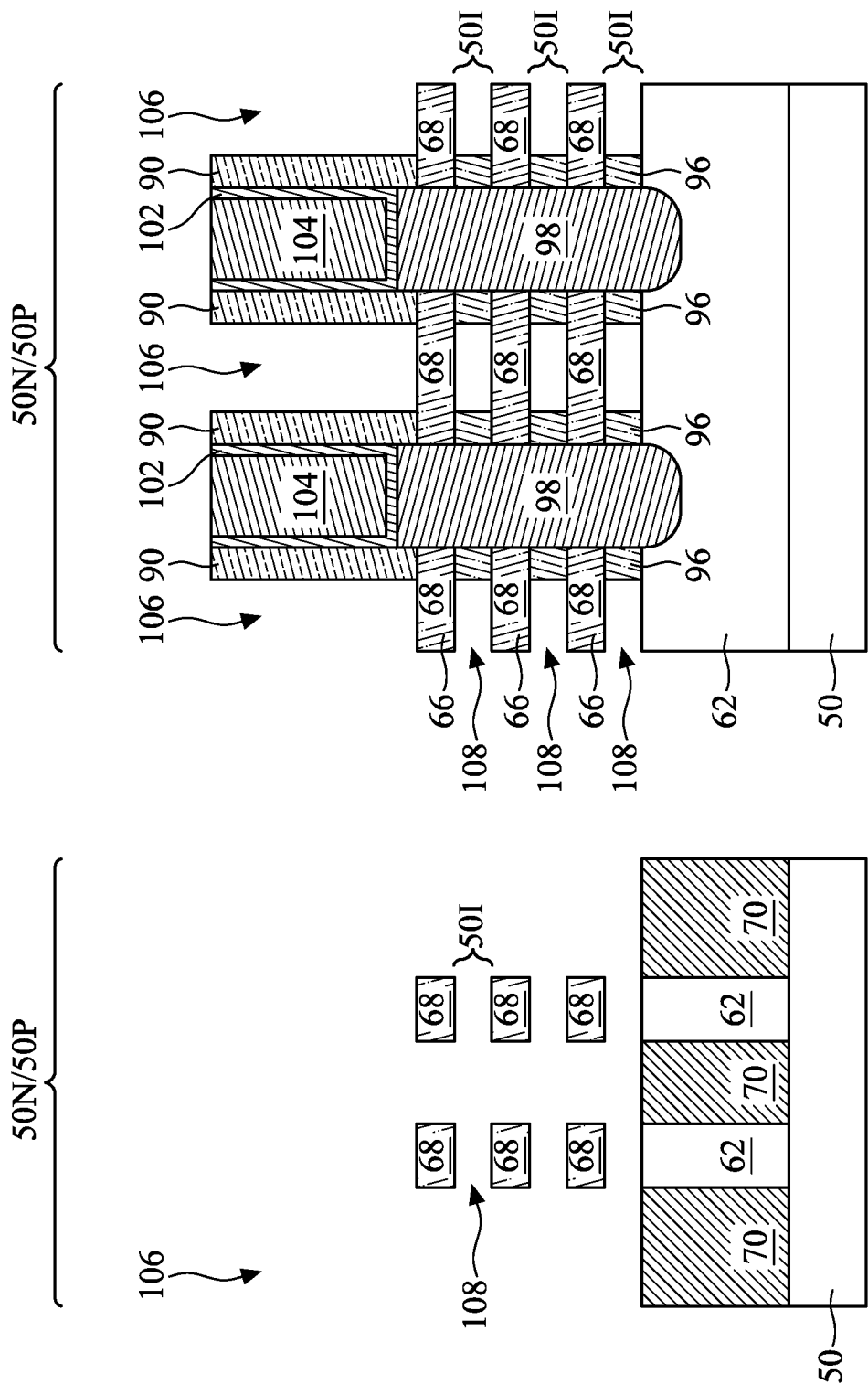

In FIGS. 16A-16B, the masks 86 (if present) and the dummy gates 84 are removed in an etching process, so that recesses 106 are formed. Portions of the dummy dielectrics 82 in the recesses 106 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between adjacent pairs of the epitaxial source/drain regions 98.

The remaining portions of the first nanostructures 64 are then removed to expand the recesses 106, such that openings 108 are formed in regions 501 between the second nanostructures 66. The remaining portions of the first nanostructures 64 can be removed by any acceptable etching process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etching process may be a wet etch using tetramethylammonium hydroxide (TMAH), ammonium hydroxide (NH$_4$OH), or the like. In some embodiments, a trim process (not separately illustrated) is performed to decrease the thicknesses of the exposed portions of the second nanostructures 66.

Figure 17B:
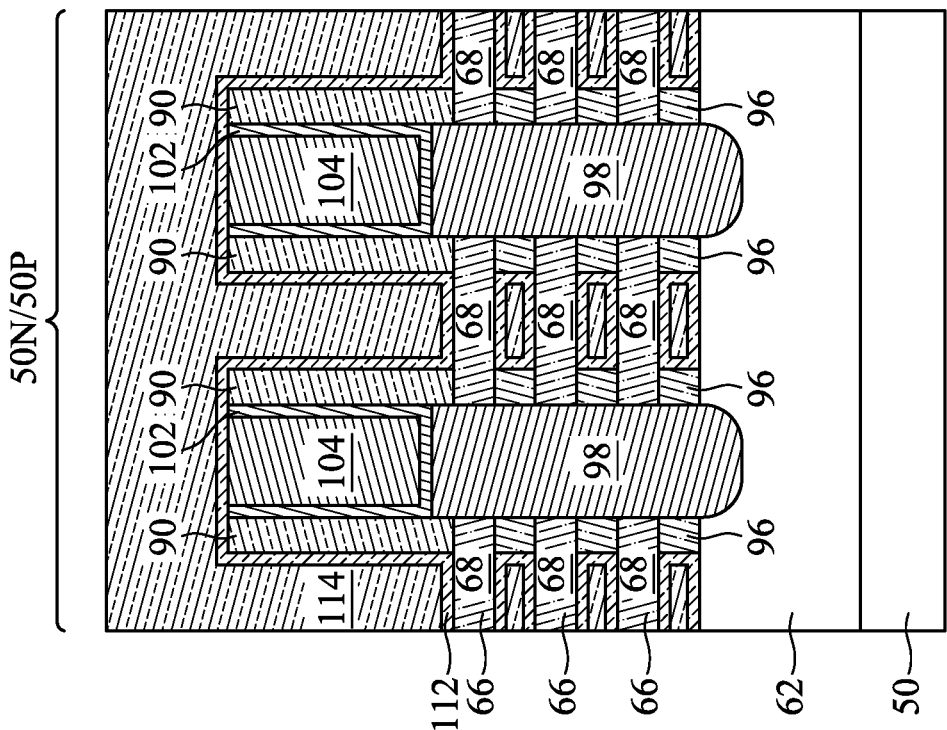
Figure 17A:
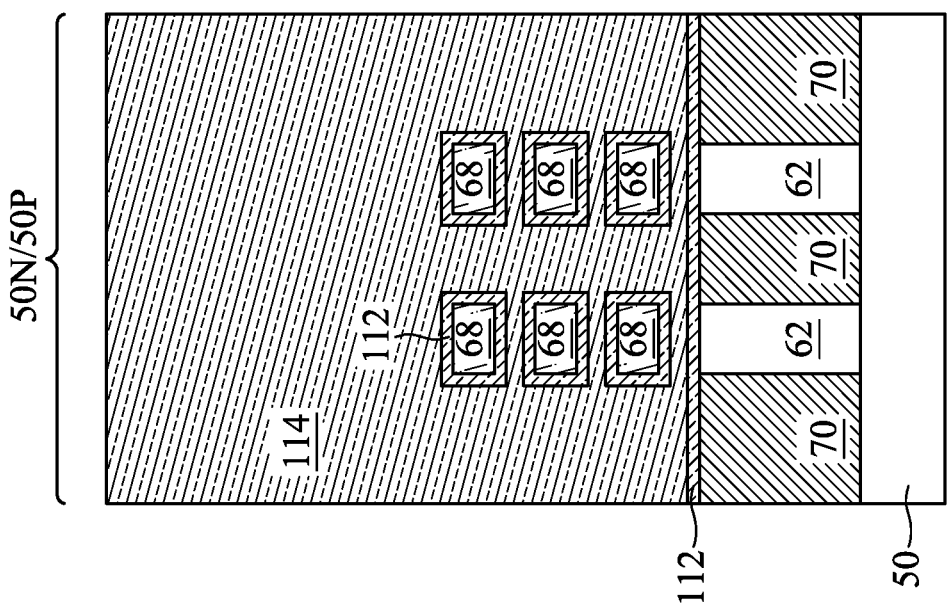

In FIGS. 17A-17B, a gate dielectric layer 112 is formed in the recesses 106. A gate electrode layer 114 is formed on the gate dielectric layer 112. The gate dielectric layer 112 and the gate electrode layer 114 are layers for replacement gates, and each wrap around all (e.g., four) sides of the second nanostructures 66. Thus, the gate dielectric layer 112 and the gate electrode layer 114 are formed in the openings 108 between the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. Although a single-layered gate dielectric layer 112 is illustrated in FIGS. 17A-17B, the gate dielectric layer 112 may include any number of interfacial layers and any number of main layers.

The gate electrode layer 114 may include a metal-containing material such as titanium nitride, titanium oxide, tungsten, cobalt, ruthenium, aluminum, combinations thereof, multi-layers thereof, or the like. Although a single-layered gate electrode layer 114 is illustrated in FIGS. 17A-17B, the gate electrode layer 114 may include any number of work function tuning layers, any number of barrier layers, any number of glue layers, and a fill material.

The formation of the gate dielectric layers 112 in the n-type region 50N and the p-type region 50P may occur simultaneously such that the gate dielectric layers 112 in each region are formed of the same materials, and the formation of the gate electrode layers 114 may occur simultaneously such that the gate electrode layers 114 in each region are formed of the same materials. In some embodiments, the gate dielectric layers 112 in each region may be formed by distinct processes, such that the gate dielectric layers 112 may be different materials and/or have a different number of layers, and/or the gate electrode layers 114 in each region may be formed by distinct processes, such that the gate electrode layers 114 may be different materials and/or have a different number of layers. Various masking steps may be used to mask and expose appropriate regions when using distinct processes.

Figure 18B:
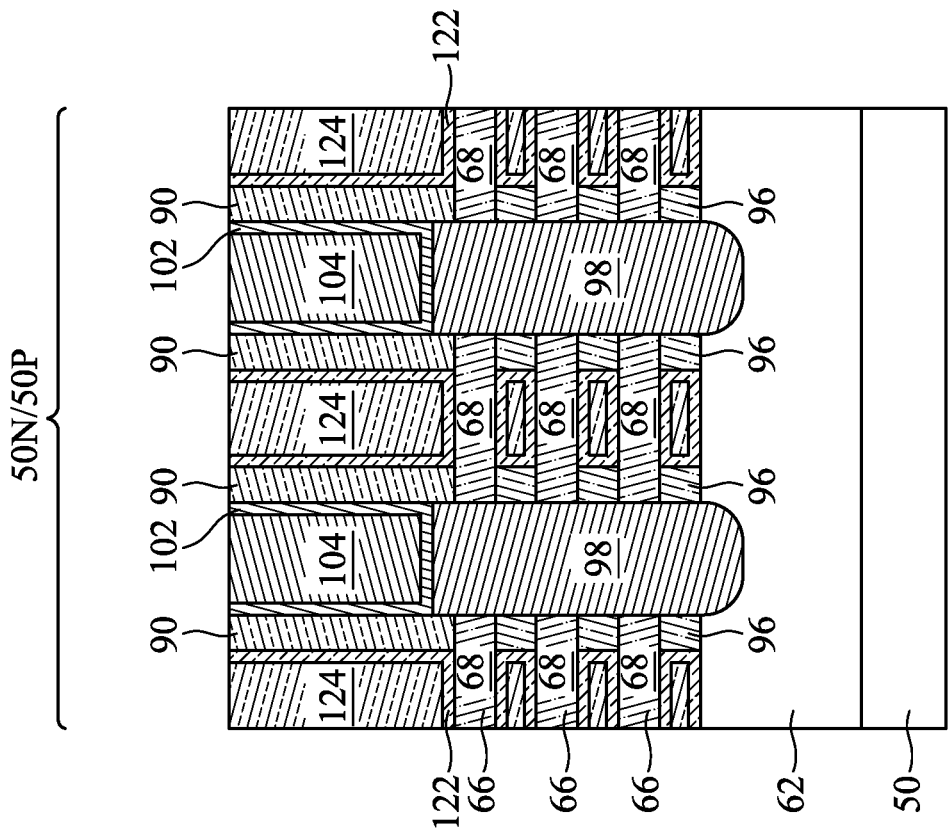
Figure 18A:
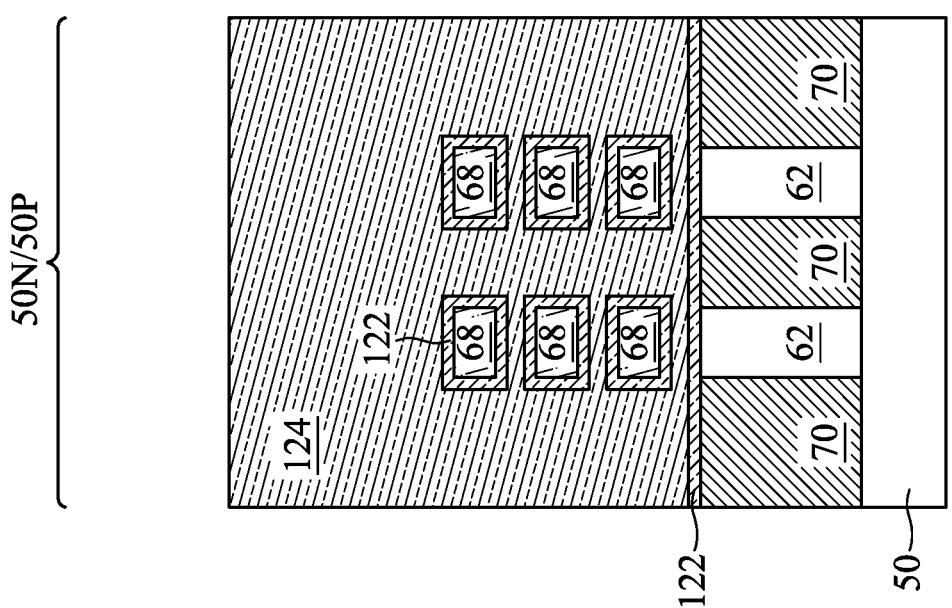

In FIGS. 18A-18B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 122 and gate electrodes 124. In some embodiments, a planarization process such as a chemical mechanical polish (CMP), an etch-back process, combinations thereof, or the like may be utilized. The gate dielectric layer 112, when planarized, has portions left in the recesses 106 (thus forming the gate dielectrics 122). The gate electrode layer 114, when planarized, has portions left in the recesses 106 (thus forming the gate electrodes 124). The top surfaces of the gate spacers 90; the CESL 102; the first ILD 104; the gate dielectrics 122; and the gate electrodes 124 are coplanar (within process variations). The gate dielectrics 122 and the gate electrodes 124 form replacement gates of the resulting nano-FETs (sometimes referred to as "metal gates"). Each respective pair of a gate dielectric 122 and a gate electrode 124 may be collectively referred to as a "gate structure." The gate structures each extend along top surfaces, sidewalls, and bottom surfaces of a channel region 68 of the second nanostructures 66.

Figure 19B:
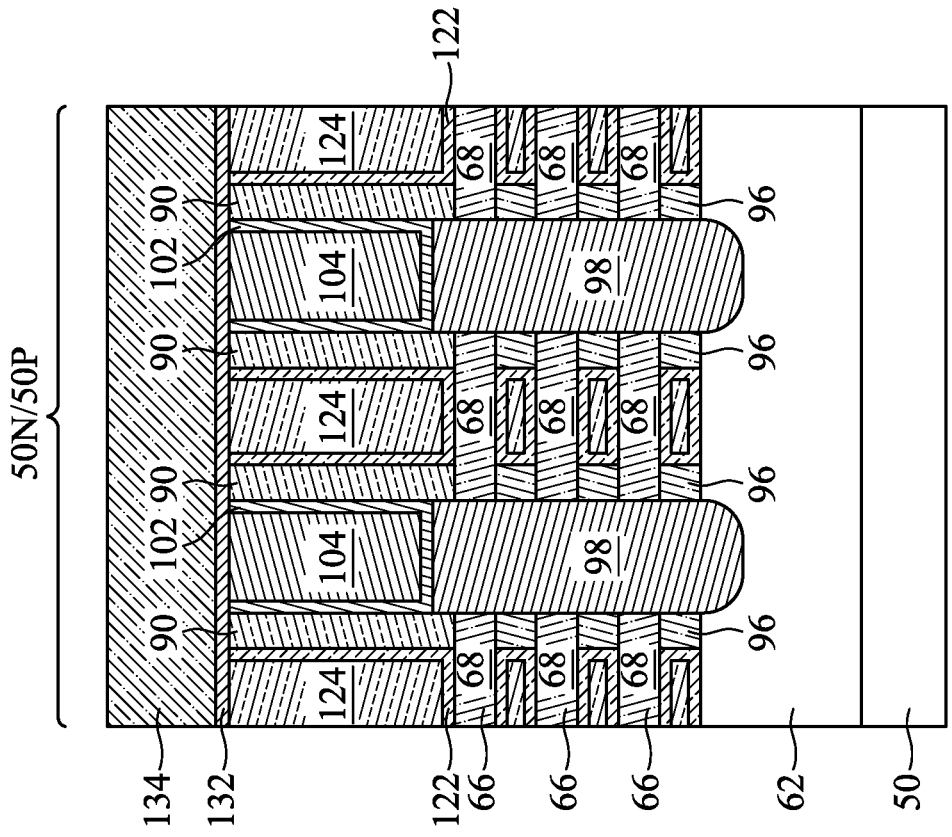
Figure 19A:
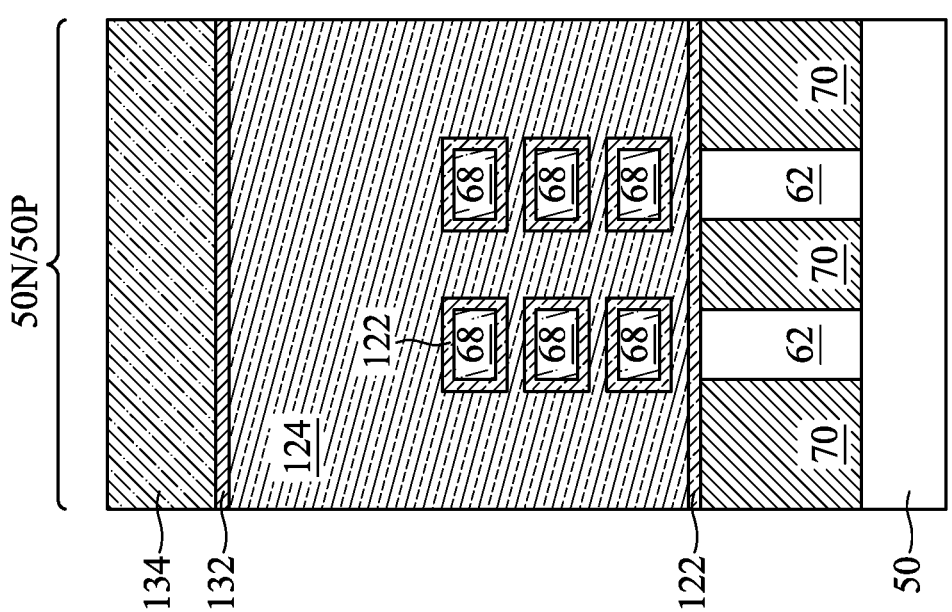

In FIGS. 19A-19B, a second ILD 134 is deposited over the gate spacers 90, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be deposited by any suitable method, such as CVD, PECVD, or the like.

In some embodiments, an etch stop layer (ESL) 132 is formed between the second ILD 134 and the gate spacers 90, the CESL 102, the first ILD 104, the gate dielectrics 122, and the gate electrodes 124. The ESL 132 may include a dielectric material, such as, silicon nitride, silicon oxide, silicon oxynitride, or the like, having a high etching selectivity from the etching of the second ILD 134.

In FIGS. 20A-20B, gate contacts 142 and source/drain contacts 144 are formed to contact, respectively, the gate electrodes 124 and the epitaxial source/drain regions 98. The gate contacts 142 are physically and electrically coupled to the gate electrodes 124. The source/drain contacts 144 are physically and electrically coupled to the epitaxial source/drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Figure 21B:
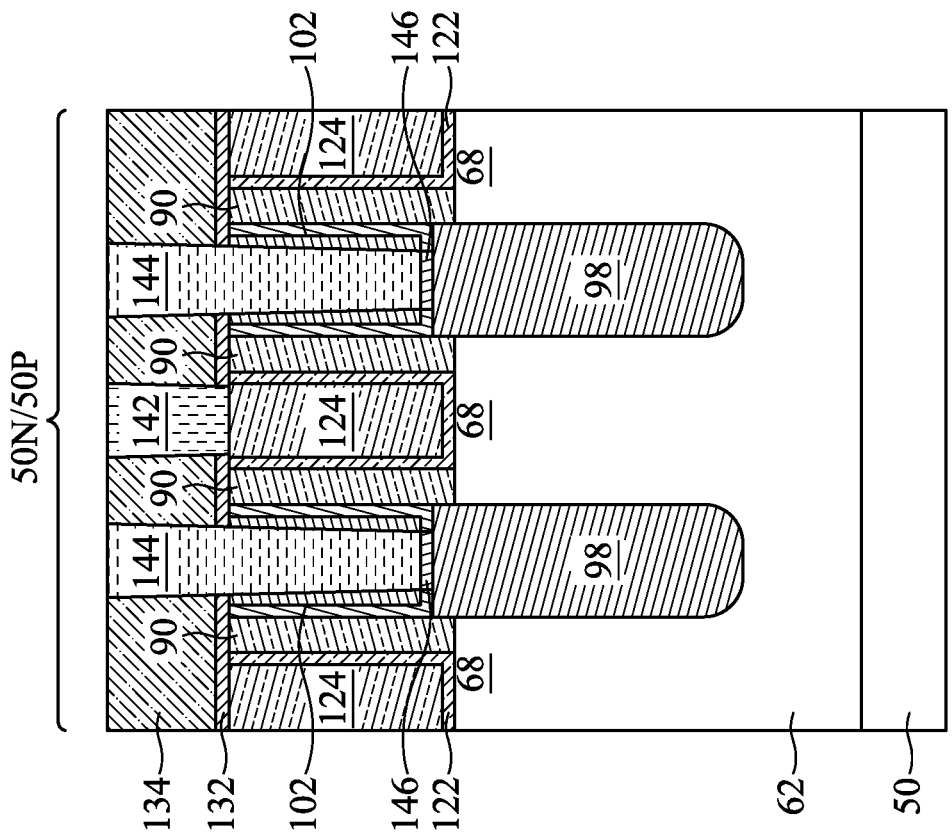
FIGS. 21A-21B are views of fin field-effect transistors (finFETs), in accordance with some embodiments.
Figure 21A:
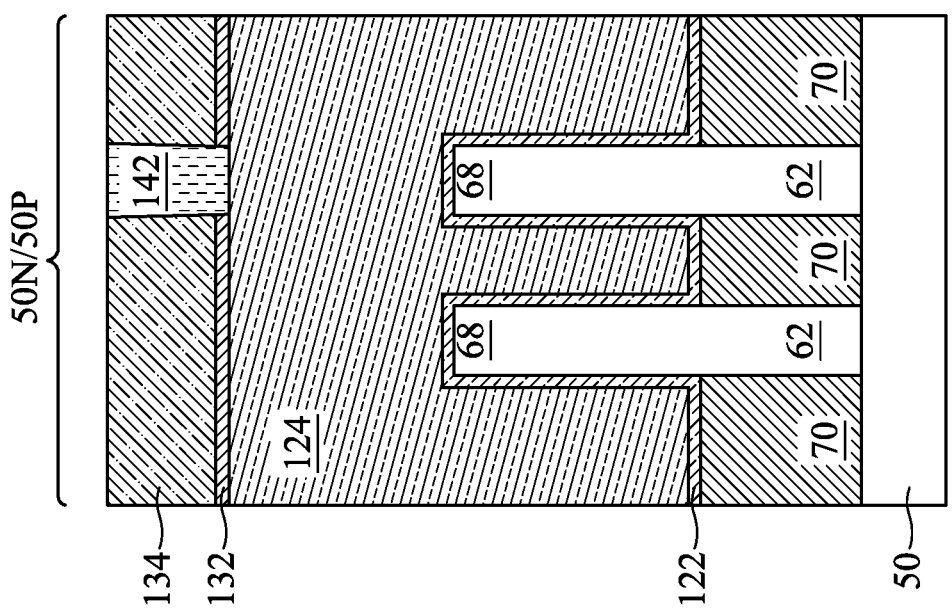
Figure 22:
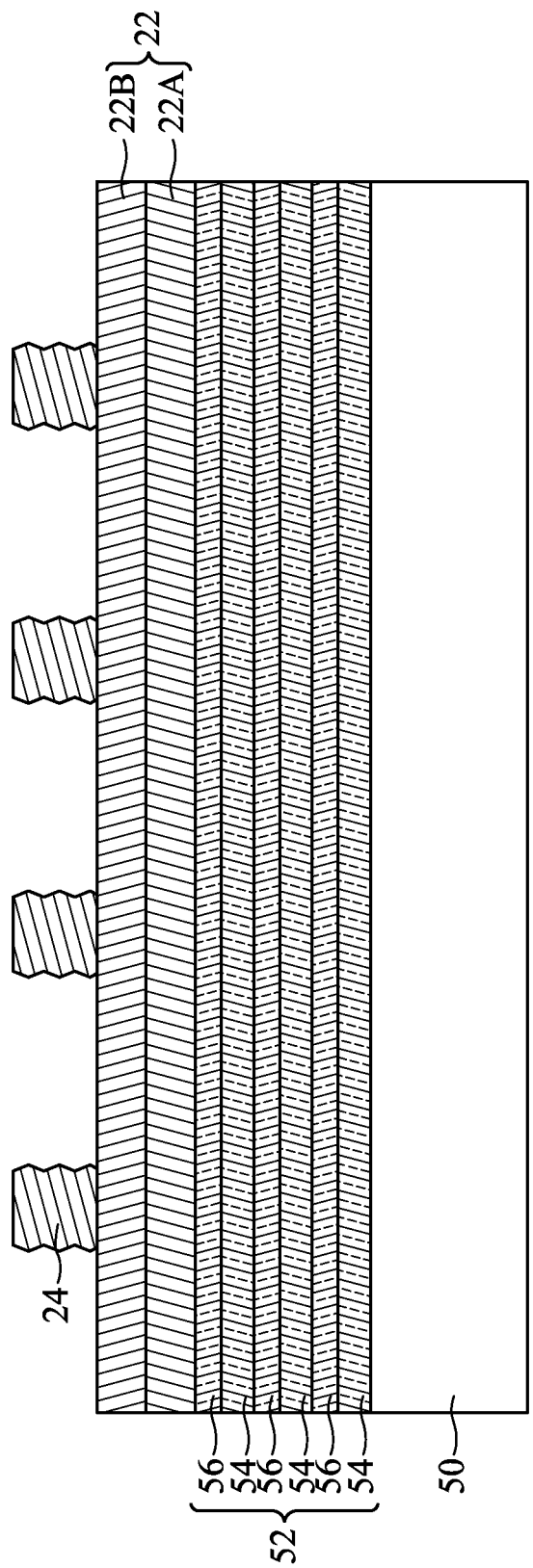
FIGS. 22-25 illustrate a process for patterning features in a multi-layer stack, in accordance with some embodiments.
Figure 23:
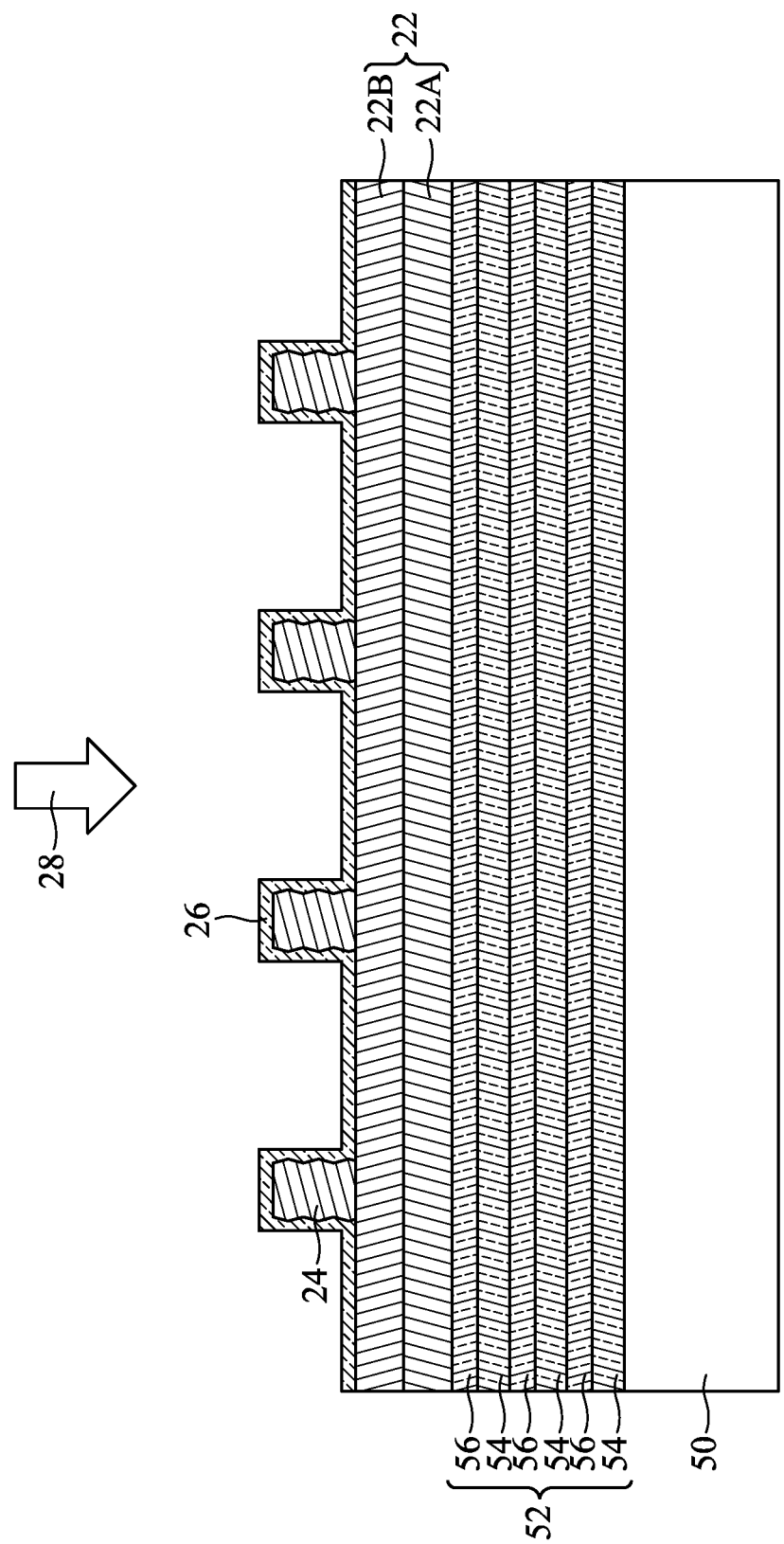
Figure 24:
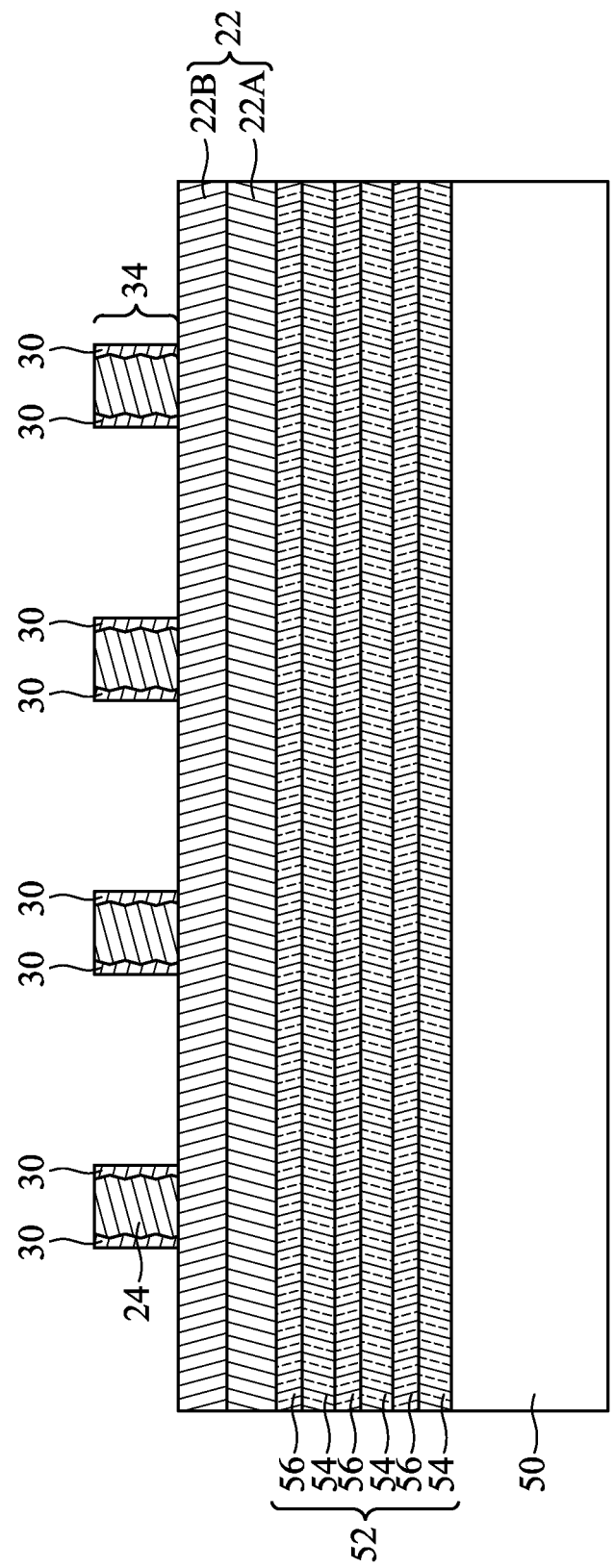
Figure 25:
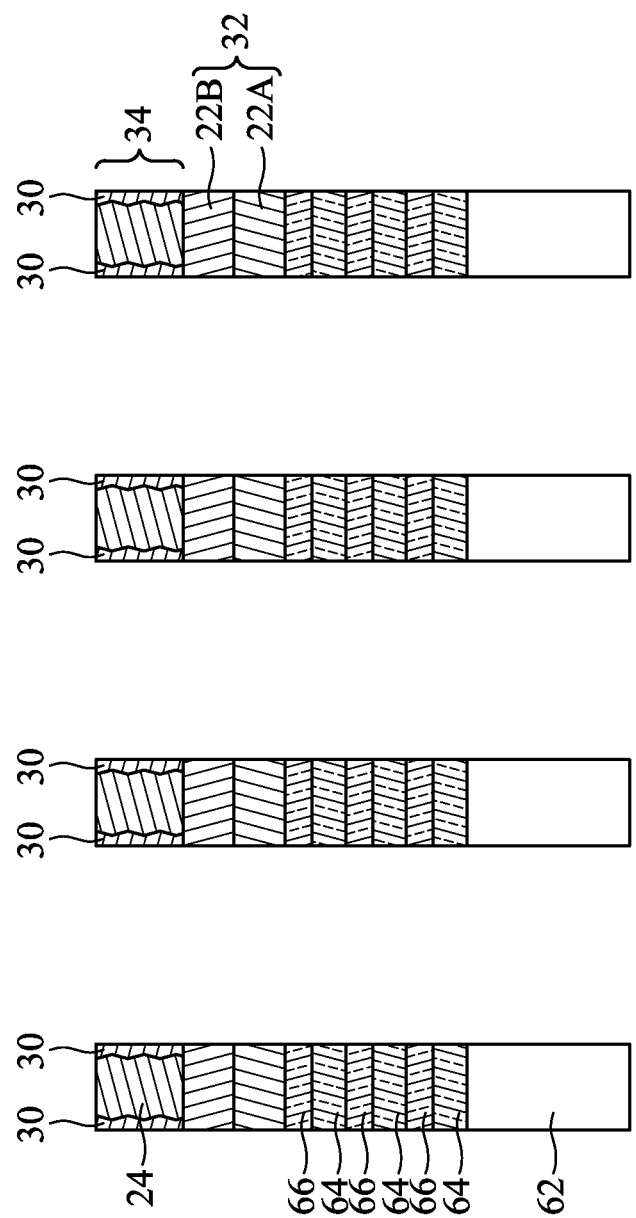
Figure 26:
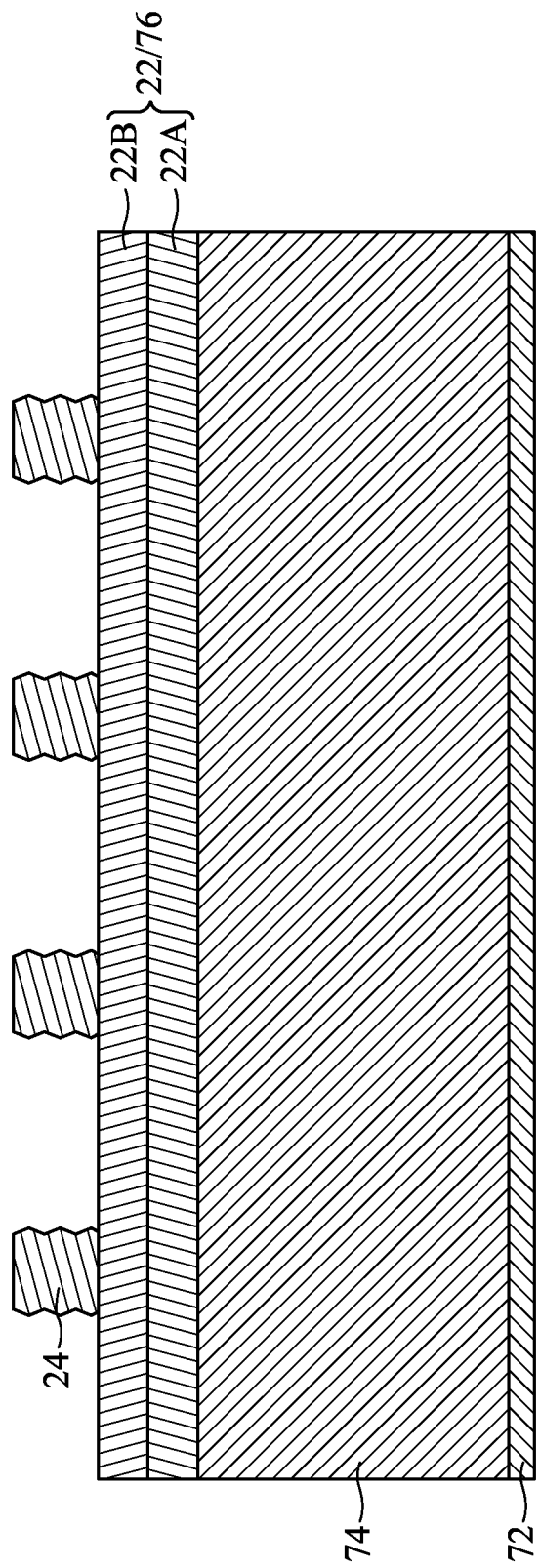
FIGS. 26-29 illustrate a process for patterning features in a dummy gate layer, in accordance with some embodiments.
Figure 27:
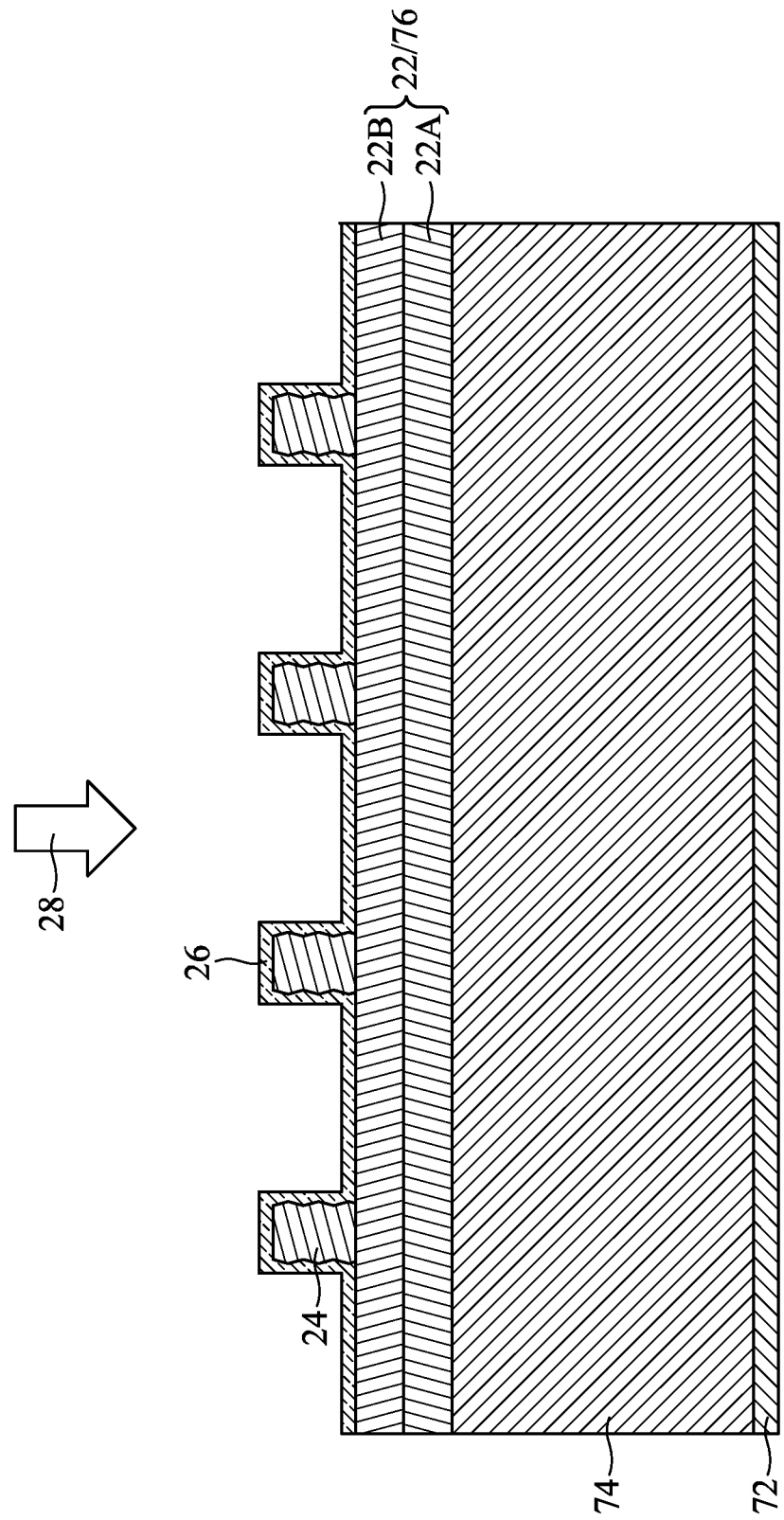
Figure 28:
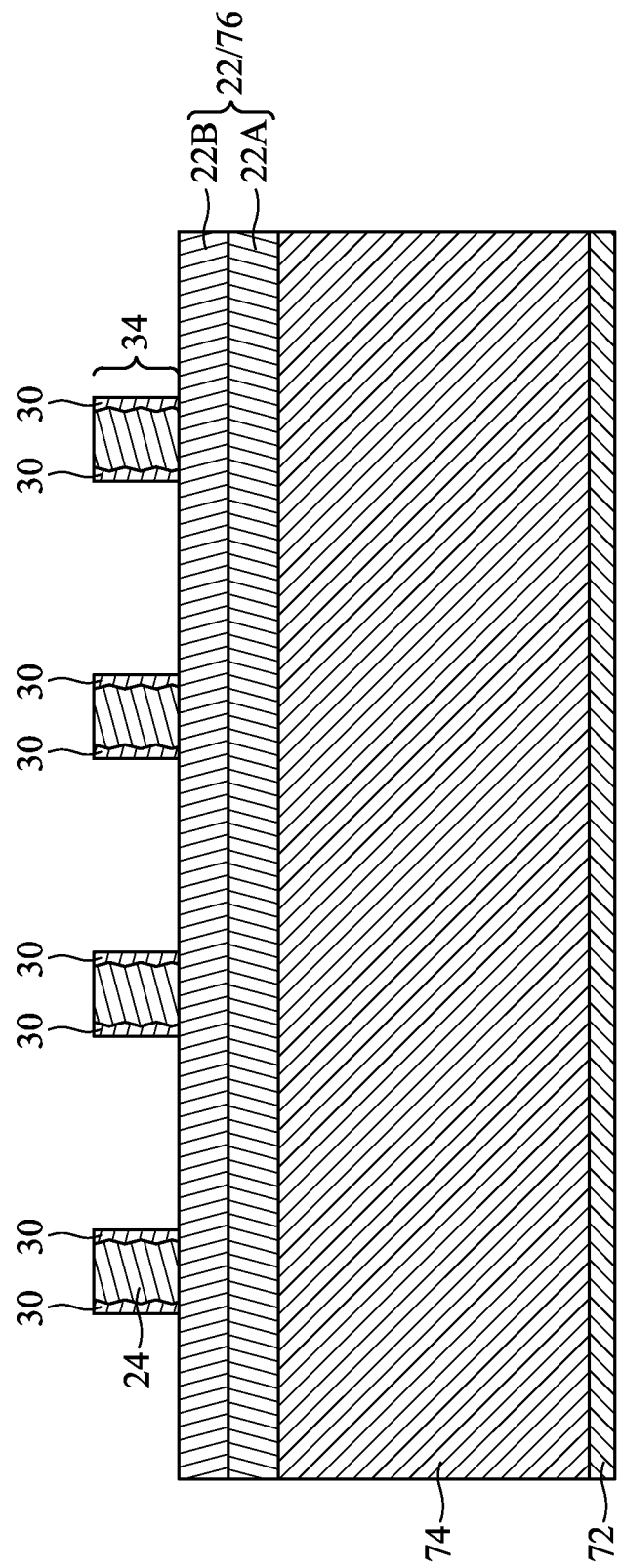
Figure 29:
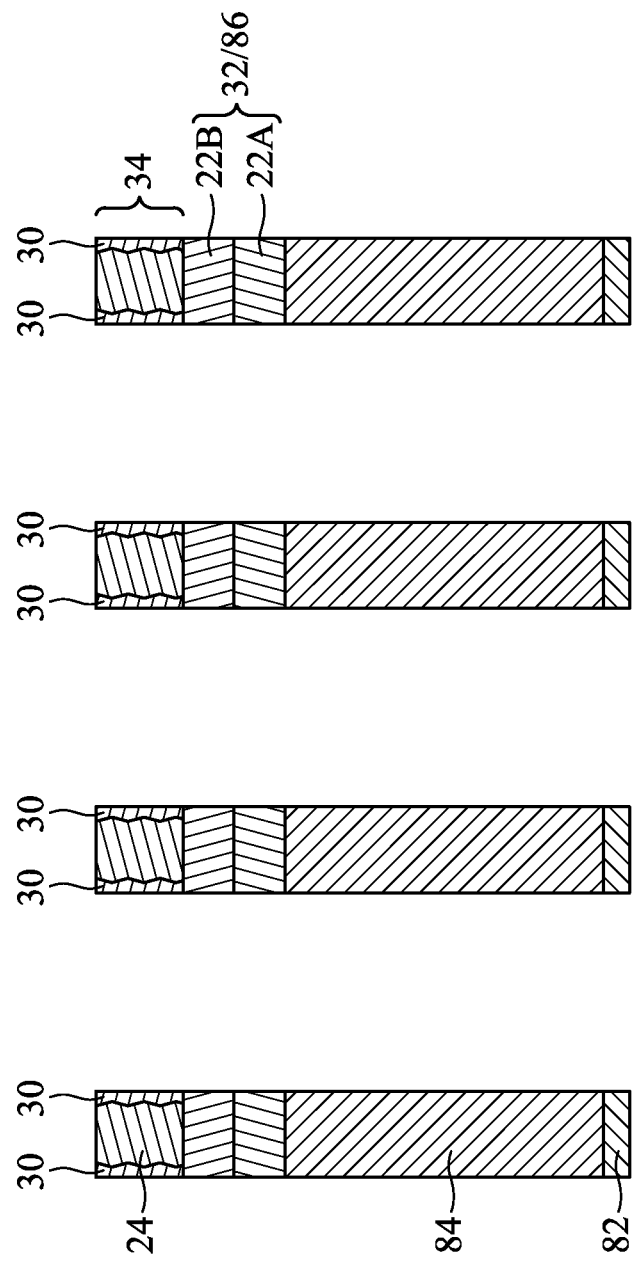

As previously noted, some embodiments contemplate aspects used in planar devices, such as planar FETs or in fin field-effect transistors (finFETs). FIGS. 21A-21B are views of finFETs, in accordance with some embodiments. FIGS. 21A-21B show a similar view as FIGS. 20A-20B, except for finFETs instead of nano-FETs. In this embodiment, the fins 62 comprise the channel regions 68, and the gate structures extend along the sidewalls and the top surfaces of the fins 62. The fins 62 may be formed in the substrate 50, in a similar manner as described for FIG. 7 (e.g., using the patterning process described for FIGS. 1-4).

Embodiments may achieve advantages. Depositing the spacer layer 26 on the sidewalls of the photoresist 24 with the plasma-enhanced deposition process 28 allows for a reduction in the roughness of the sidewalls of the photoresist 24. Further, depositing the spacer layer 26 to a sufficient thickness allows for the compensation of losses from the etching of the photoresist 24. An etching mask with smooth sidewalls may be formed, thereby decreasing the line-width roughness of underlying features that are patterned using the etching mask.

In an embodiment, a method includes: forming a photoresist over a target layer; performing a plasma-enhanced deposition process, the plasma-enhanced deposition process etching sidewalls of the photoresist while depositing a spacer layer on the sidewalls of the photoresist; patterning the spacer layer to form spacers on the sidewalls of the photoresist; and etching the target layer using the spacers and the photoresist as a combined etching mask. In some embodiments of the method, the target layer is a semiconductor substrate and etching the target layer forms a channel region for a transistor. In some embodiments of the method, the target layer is a conductive layer and etching the target layer forms a gate structure for a transistor. In some embodiments of the method, the sidewalls of the photoresist have a first roughness before the plasma-enhanced deposition process, the sidewalls of the photoresist have a second roughness after the plasma-enhanced deposition process, and the second roughness is less than the first roughness. In some embodiments of the method, sidewalls of the combined etching mask have a third roughness, and the third roughness is less than the second roughness. In some embodiments of the method, the photoresist has a first width before the plasma-enhanced deposition process, the photoresist has a second width after the plasma-enhanced deposition process, and the second width is less than the first width. In some embodiments of the method, the combined etching mask has a third width, and the third width is greater than the second width. In some embodiments of the method, the spacer layer includes silicon oxide, and the plasma-enhanced deposition process includes plasma-enhanced atomic layer deposition performed with a silicon-containing precursor and an oxygen-containing precursor.

In an embodiment, a method includes: forming a photoresist over a semiconductor substrate; decreasing roughness of sidewalls of the photoresist by etching the sidewalls of the photoresist; depositing an oxide layer on the sidewalls of the photoresist while etching the sidewalls of the photoresist; etching the oxide layer to form spacers on the sidewalls of the photoresist; and forming a channel region by etching trenches in the semiconductor substrate using the spacers and the photoresist as a combined etching mask. In some embodiments of the method, etching the trenches in the semiconductor substrate forms a nanostructure having the channel region. In some embodiments of the method, etching the trenches in the semiconductor substrate forms a fin having the channel region. In some embodiments of the method, etching the sidewalls of the photoresist decreases a width of the photoresist.

In an embodiment, a method includes: forming a photoresist over a substrate; performing an ALD cycle including: exposing the photoresist to a silicon-containing precursor in a first pulse of the ALD cycle; exposing the photoresist to an oxygen-containing precursor in a second pulse of the ALD cycle, the oxygen-containing precursor reacting with the silicon-containing precursor to deposit a spacer material on sidewalls of the photoresist; and generating a plasma from the oxygen-containing precursor during the second pulse of the ALD cycle, the plasma etching the sidewalls of the photoresist; and repeating the ALD cycle a number of times. In some embodiments of the method, the second pulse of the ALD cycle is performed at a temperature in a range of room temperature to 120° C., the second pulse of the ALD cycle is performed at a pressure in a range of 1 Torr to 5 Torr, the second pulse of the ALD cycle is performed for a duration in a range of 1 minute to 5 minutes, a generation power for the plasma has a high power in a range of 15 watts to 800 watts, and the generation power for the plasma has a pulse frequency in a range of 40 kHz to 60 MHz. In some embodiments of the method, the spacer material is an oxide, the silicon-containing precursor is silane, and the oxygen-containing precursor is oxygen gas. In some embodiments of the method, the spacer material is an oxide, the silicon-containing precursor is silane, and the oxygen-containing precursor is ozone. In some embodiments of the method, the spacer material is silicon oxide, and the method further includes: patterning the spacer material to form spacers on the sidewalls of the photoresist by performing an anisotropic dry etch with a halogen-based etchant. In some embodiments, the method further includes: patterning the spacer material to form spacers on the sidewalls of the photoresist; etching the substrate using the spacers and the photoresist as a combined etching mask to form a fin; and forming a gate structure on a channel region of the fin. In some embodiments, the method further includes: patterning the spacer material to form spacers on the sidewalls of the photoresist; etching the substrate using the spacers and the photoresist as a combined etching mask to form a nanostructure; and forming a gate structure on a channel region of the nanostructure. In some embodiments, the method further includes: patterning the spacer material to form spacers on the sidewalls of the photoresist; etching the substrate using the spacers and the photoresist as a combined etching mask to form a dummy gate on a channel region; and replacing the dummy gate with a metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a photoresist with a first width over a target layer by a photolithography process;
   performing a plasma-enhanced deposition process, the plasma-enhanced deposition process decreasing roughness of sidewalls of the photoresist while depositing a spacer layer, horizontal portions of the spacer layer being deposited on top surfaces of the photoresist, vertical portions of the spacer layer being deposited on the sidewalls of the photoresist, wherein the photoresist has the first width at the start of the plasma-enhanced deposition process, wherein the photoresist has a second width at the end of the plasma-enhanced deposition process;
   patterning the spacer layer to form spacers on the sidewalls of the photoresist, wherein patterning the spacer layer comprises performing an etching process, wherein the etching process selectively etches the horizontal portions of the spacer layer at a faster rate than the vertical portions of the spacer layer, wherein the photoresist has the second width at the start of the etching process, wherein the second width is in a range of 15 nm to 80 nm; and
   etching the target layer using the spacers and the photoresist as a combined etching mask.

2. The method of claim 1, wherein the target layer is a semiconductor substrate and etching the target layer forms a channel region for a transistor.

3. The method of claim 1, wherein the target layer is a conductive layer and etching the target layer forms a gate structure for a transistor.

4. The method of claim 1, wherein the sidewalls of the photoresist have a first roughness before the plasma-enhanced deposition process, the sidewalls of the photoresist have a second roughness after the plasma-enhanced deposition process, sidewalls of the combined etching mask have a third roughness, the third roughness is less than the second roughness, and the second roughness is less than the first roughness.

5. The method of claim 1, wherein the second width is less than the first width.

6. The method of claim 5, wherein the combined etching mask has a third width, and the third width is greater than the second width.

7. The method of claim 1, wherein the spacer layer comprises silicon oxide, and the plasma-enhanced deposition process comprises plasma-enhanced atomic layer deposition performed with a silicon-containing precursor and an oxygen-containing precursor.

8. A method comprising:
   forming a photoresist over a semiconductor substrate;
   decreasing roughness of sidewalls of the photoresist by etching the sidewalls of the photoresist;
   depositing an oxide layer on the sidewalls of the photoresist while decreasing the roughness of the sidewalls of the photoresist, wherein the photoresist has a width in a range of 15 nm to 80 nm after the sidewalls of the photoresist are etched;
   etching the oxide layer to form spacers on the sidewalls of the photoresist, wherein etching the oxide layer comprises performing an etching process, the etching process selectively etching horizontal portions of the oxide layer at a faster rate than vertical portions of the oxide layer, the vertical portions of the oxide layer formed on the sidewalls of the photoresist, wherein the photoresist has the width in the range of 15 nm to 80 nm at the start of the etching process; and
   forming a channel region by etching trenches in the semiconductor substrate using the spacers and the photoresist as a combined etching mask.

9. The method of claim 8, wherein etching the trenches in the semiconductor substrate forms a nanostructure having the channel region.

10. The method of claim 8, wherein etching the trenches in the semiconductor substrate forms a fin having the channel region.

11. The method of claim 8, wherein etching the sidewalls of the photoresist decreases the width of the photoresist.

12. A method comprising:
    forming a photoresist over a substrate by a photolithography process, the photoresist comprising a photosensitive material, wherein polymers aggregate in the photosensitive material during the photolithography process such that sidewalls of the photoresist have a roughness in a range of 3 nm to 8 nm;
    performing an atomic layer deposition (ALD) cycle comprising:
      exposing the photoresist to a silicon-containing precursor in a first pulse of the ALD cycle;
      exposing the photoresist to an oxygen-containing precursor in a second pulse of the ALD cycle, the oxygen-containing precursor reacting with the silicon-containing precursor to deposit a spacer material on top surfaces and on the sidewalls of the photoresist; and generating a plasma from the oxygen-containing precursor during the second pulse of the ALD cycle, the plasma etching the sidewalls of the photoresist to reduce the roughness of the sidewalls of the photoresist;

repeating the ALD cycle a number of times; and patterning the spacer material to form spacers on the sidewalls of the photoresist, wherein patterning the spacer material comprises removing the spacer material from the top surfaces of the photoresist at a faster rate than from the sidewalls of the photoresist, wherein the photoresist has a width in a range of 15 nm to 80 nm at the start of the patterning the spacer material.

13. The method of claim 12, wherein the second pulse of the ALD cycle is performed at a temperature in a range of room temperature to 120° C., the second pulse of the ALD cycle is performed at a pressure in a range of 1 Torr to 5 Torr, the second pulse of the ALD cycle is performed for a duration in a range of 1 minute to 5 minutes, a generation power for the plasma has a high power in a range of 15 watts to 800 watts, and the generation power for the plasma has a pulse frequency in a range of 40 kHz to 60 MHz.

14. The method of claim 12, wherein the spacer material is an oxide, the silicon-containing precursor is silane, and the oxygen-containing precursor is oxygen gas.

15. The method of claim 12, wherein the spacer material is an oxide, the silicon-containing precursor is silane, and the oxygen-containing precursor is ozone.

16. The method of claim 12, wherein the spacer material is silicon oxide, and removing the spacer material comprises performing an anisotropic dry etch with a halogen-based etchant.

17. The method of claim 12 further comprising:
etching the substrate using the spacers and the photoresist as a combined etching mask to form a fin; and
forming a gate structure on a channel region of the fin.

18. The method of claim 12 further comprising:
etching the substrate using the spacers and the photoresist as a combined etching mask to form a nanostructure; and
forming a gate structure on a channel region of the nanostructure.

19. The method of claim 12 further comprising:
etching the substrate using the spacers and the photoresist as a combined etching mask to form a dummy gate on a channel region; and
replacing the dummy gate with a metal gate.

20. The method of claim 12, wherein the photoresist has a width in a range of 15 nm to 80 nm at the end of the repeating the ALD cycle the number of times.

* * * * *